(12) United States Patent
Lee et al.

(10) Patent No.: US 11,733,819 B2
(45) Date of Patent: Aug. 22, 2023

(54) ELECTRONIC APPARATUS

(71) Applicant: SAMSUNG DISPLAY CO., LTD., Yongin-si (KR)

(72) Inventors: Kyungsu Lee, Suwon-si (KR); Jong-Hwa Kim, Yongin-si (KR); Jeongyun Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/815,301

(22) Filed: Jul. 27, 2022

(65) Prior Publication Data

US 2022/0365628 A1 Nov. 17, 2022

Related U.S. Application Data

(62) Division of application No. 17/070,202, filed on Oct. 14, 2020, now Pat. No. 11,429,238.

(30) Foreign Application Priority Data

Nov. 26, 2019 (KR) .......................... 10-2019-0153451

(51) Int. Cl.
*G06F 3/044* (2006.01)
*G06F 3/041* (2006.01)
*G09G 3/3233* (2016.01)
*H10K 59/40* (2023.01)

(52) U.S. Cl.
CPC .......... *G06F 3/0446* (2019.05); *G06F 3/0412* (2013.01); *G06F 3/0443* (2019.05); *G06F 3/04164* (2019.05); *G06F 2203/04107* (2013.01); *G06F 2203/04111* (2013.01); *G09G 3/3233* (2013.01); *H10K 59/40* (2023.02)

(58) Field of Classification Search
None
See application file for complete search history.

(56) References Cited

U.S. PATENT DOCUMENTS

| | | | |
|---|---|---|---|
| 9,658,650 B2 * | 5/2017 | Cho | ........................ G06F 1/1652 |
| 10,405,349 B2 | 9/2019 | Biswas et al. | |
| 2014/0374795 A1 | 12/2014 | Pluntke et al. | |
| 2015/0346869 A1 | 12/2015 | Jang | |

(Continued)

FOREIGN PATENT DOCUMENTS

| | | |
|---|---|---|
| KR | 10-2016-0072909 | 6/2016 |
| KR | 10-2020-0047945 | 5/2020 |
| KR | 10-2021-0065244 | 6/2021 |

*Primary Examiner* — Duane N Taylor, Jr.
(74) *Attorney, Agent, or Firm* — F. Chau & Associates, LLC

(57) ABSTRACT

The present disclosure relates to an electronic apparatus. The electronic apparatus includes a base substrate through which a hole is defined, a cover portion, a first sensing electrode, a second sensing electrode, a dummy electrode, and a ground line. The cover portion surrounds the hole and includes at least one cover pattern. The first sensing electrode includes first sensing patterns. The second sensing electrode includes second sensing patterns. The dummy electrode includes dummy patterns disposed between the first sensing patterns and the second sensing patterns. The ground line is electrically connected to the cover portion through at least some of the dummy patterns.

5 Claims, 15 Drawing Sheets

(56) References Cited

U.S. PATENT DOCUMENTS

| | | | |
|---|---|---|---|
| 2016/0179229 A1* | 6/2016 | Ahn | .................... G06F 3/04164 |
| | | | 345/173 |
| 2017/0177313 A1 | 6/2017 | Slesarenko et al. | |
| 2017/0277313 A1 | 9/2017 | Lee et al. | |
| 2017/0294502 A1 | 10/2017 | Ka et al. | |
| 2018/0067584 A1 | 3/2018 | Zhu et al. | |
| 2018/0088704 A1 | 3/2018 | Schlegelmilch et al. | |
| 2019/0079622 A1 | 3/2019 | Choi et al. | |
| 2020/0133415 A1 | 4/2020 | Choi et al. | |

* cited by examiner

FIG. 8A
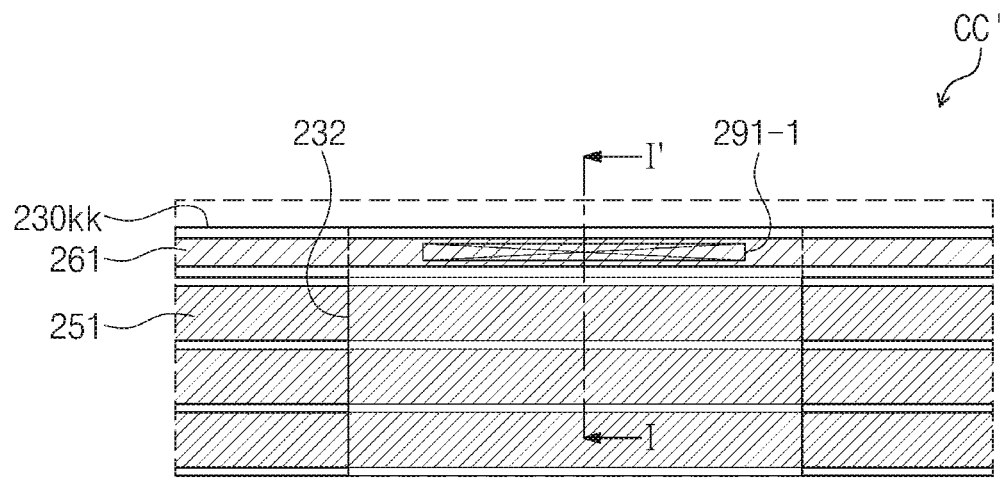
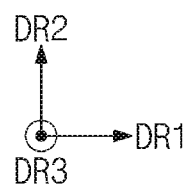
FIG. 8B
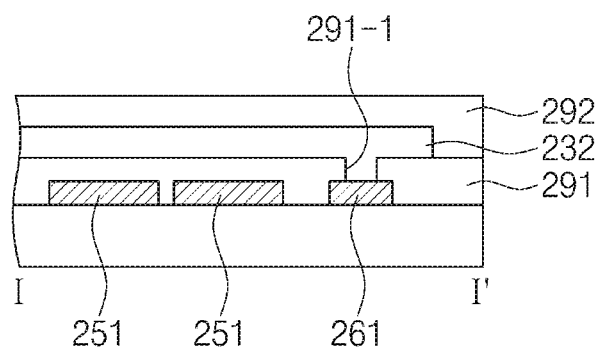
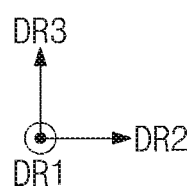

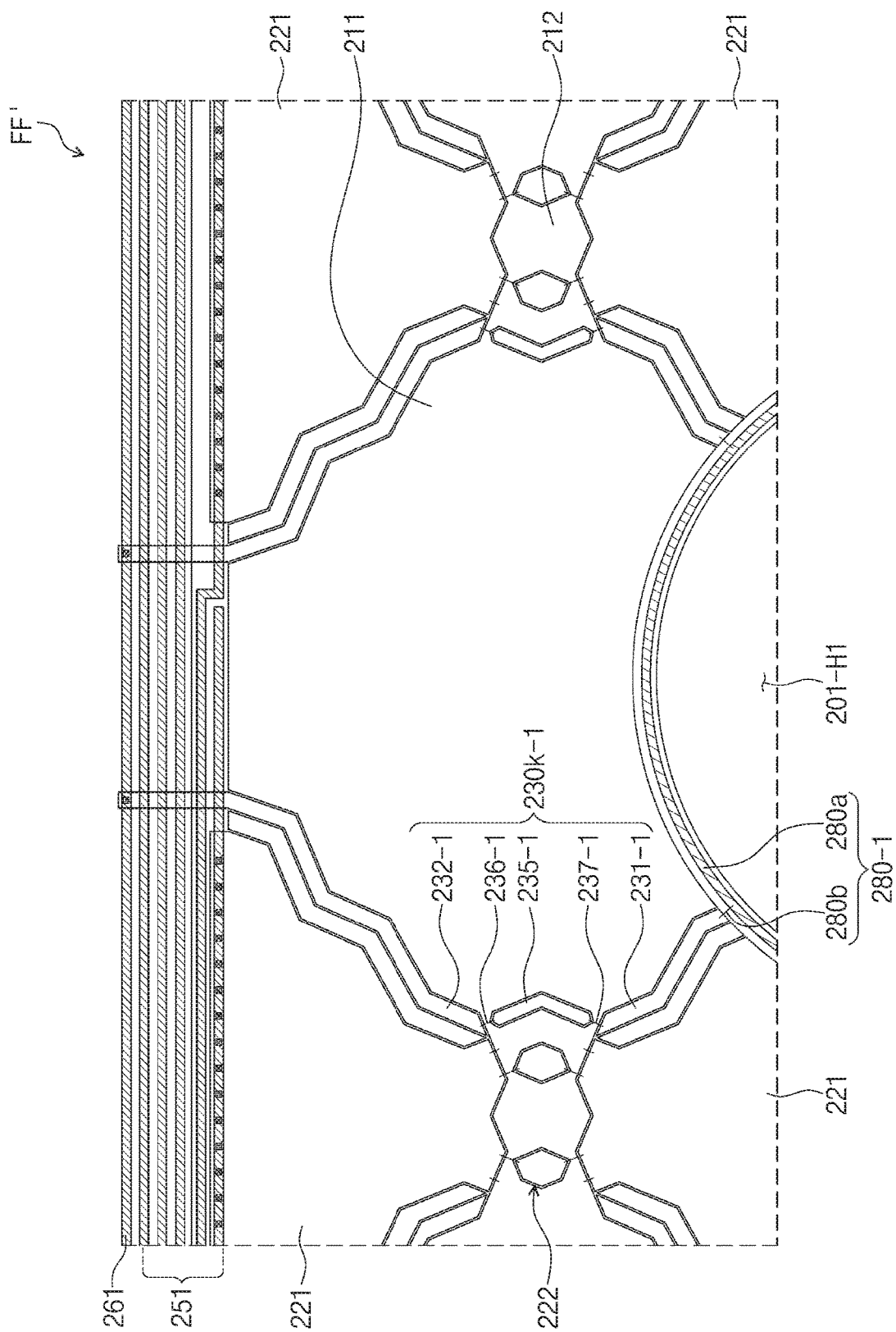

ELECTRONIC APPARATUS

CROSS-REFERENCE TO RELATED APPLICATION

This U.S. non-provisional patent application claims priority to Korean Patent Application No. 10-2019-0153451, filed on Nov. 26, 2019, and U.S. patent application Ser. No. 17/070,202, filed on Oct. 14, 2020, the contents of which are hereby incorporated by reference in their entirety.

BACKGROUND

1. Field of Disclosure

The present disclosure relates to an electronic apparatus. More particularly, the present disclosure relates to an electronic apparatus for sensing an external input.

2. Description of the Related Art

Electronic devices include items such as smartphones, computers, televisions, and the like. These electronic devises contain sensitive electronic components that may be damaged as a result of an electrostatic discharge event.

Electrostatic discharge is a sudden, and potentially damaging, flow of electricity through one or more electronic components. A buildup of static energy may pass through the components of an electronic device, causing damage to the device.

The damage caused by the electrostatic discharge event may render the device unusable. Therefore, there is a need in the art for a method to reduce the likelihood of electrostatic discharge damaging components of an electronic device.

SUMMARY

The present disclosure provides an electronic apparatus with increased reliability.

Embodiments of the inventive concept provide an electronic apparatus including a base substrate in which a hole, a first area surrounding the hole, a second area surrounding the first area, and a third area surrounding the second area are defined, a cover portion disposed in the first area and including at least one cover pattern, a first sensing electrode disposed in the second area and including first sensing patterns arranged in a first direction, a second sensing electrode disposed in the second area and including second sensing patterns arranged in a second direction crossing the first direction, a dummy electrode disposed in the second area and including dummy patterns disposed between the first sensing patterns and the second sensing patterns, and a ground line disposed in the third area and electrically connected to the cover portion through at least some of the dummy patterns.

The cover portion includes a first cover pattern surrounding the hole and a second cover pattern surrounding the first cover pattern, and the second cover pattern has a width smaller than a width of the first cover pattern. The cover portion further includes a connection pattern extending from the second cover pattern to an area overlapping the at least some of the dummy patterns. The connection pattern extends from the second cover pattern to the first cover pattern, and the connection pattern is connected to the first cover pattern. The at least some of the dummy patterns extend from the second area to an area overlapping the ground line. The cover portion and the ground line are disposed on a first layer, and the first sensing patterns, the second sensing patterns, and the dummy patterns are disposed on a second layer different from the first layer.

The electronic apparatus further includes an insulating layer disposed on the first layer and covering the ground line, and the second layer is disposed on an upper surface of the insulating layer. The insulating layer is provided with a first contact hole and a second contact hole, which are defined therethrough, some of the dummy patterns are electrically connected to the ground line through the first contact hole, and some of the dummy patterns are electrically connected to the cover portion through the second contact hole.

The dummy electrode further includes a dummy island pattern disposed on the second area, and the dummy island pattern is electrically connected to the ground line. The dummy patterns include a first dummy pattern overlapping a portion of the cover portion and a second dummy pattern overlapping the ground line, and the dummy island pattern is disposed between the first dummy pattern and the second dummy pattern to electrically connect the first dummy pattern and the second dummy pattern.

The second sensing electrode further includes an island pattern disposed between two second sensing patterns adjacent to each other among the second sensing patterns and electrically connected to the two second sensing patterns, and the dummy island pattern and the island pattern have a same area as each other. The hole includes at least one straight-line portion, and the ground line is electrically connected to the cover portion by at least one dummy pattern disposed between the straight-line portion and the ground line among the dummy patterns.

The second sensing electrode includes a first connection unit, a second connection unit spaced apart from the first connection unit to the second direction with the hole interposed therebetween, a third connection unit spaced apart from the second connection unit to the second direction, and a fourth connection unit spaced apart from the third connection unit to the second direction, and a distance between the first connection unit and the second connection unit is greater than a distance between the third connection unit and the fourth connection unit.

The distance between the first connection unit and the second connection unit is greater than a distance between the second connection unit and the third connection unit, and the distance between the second connection unit and the third connection unit may be smaller than the distance between the third connection unit and the fourth connection unit.

The second sensing pattern connected to the second connection unit and the third connection unit among the second sensing patterns has an area smaller than an area of the second sensing pattern connected to the third connection unit and the fourth connection unit among the second sensing patterns.

The second sensing electrode further includes a connection electrode that electrically connects two second sensing patterns spaced apart from each other such that the hole is disposed between the two second sensing patterns, the connection electrode is spaced apart from the first sensing patterns with at least one of the dummy patterns interposed therebetween, and the connection electrode is disposed on a same layer as the second sensing patterns and includes the same material as the second sensing patterns.

Embodiments of the inventive concept provide an electronic apparatus including a base substrate in which a hole, a first area surrounding the hole, a second area surrounding the first area, and a third area surrounding the second area are defined, a cover pattern disposed in the first area and surrounding the hole, a connection pattern protruding from the cover pattern to the second area, a first dummy pattern disposed in the second area and overlapping the connection pattern, a second dummy pattern electrically connected to the first dummy pattern and extending from the second area to the third area, and a ground line disposed in the third area, overlapping the second dummy pattern, and electrically connected to the second dummy pattern.

The electronic apparatus further includes a dummy island pattern disposed between the first dummy pattern and the second dummy pattern, a first dummy bridge pattern connected to the dummy island pattern and the first dummy pattern, and a second dummy bridge pattern connected to the dummy island pattern and the second dummy pattern. The first dummy pattern, the second dummy pattern, and the dummy island pattern are disposed on a first layer, and the cover pattern, the ground line, the first dummy bridge pattern, and the second dummy bridge pattern are disposed on a second layer different from the first layer.

The cover pattern is provided in plural, the cover patterns include a first cover pattern with a first width and a second cover pattern spaced apart from the hole such that the first cover pattern is disposed between the hole and the second cover pattern and with a second width smaller than the first width, the second cover pattern is electrically connected to the ground line, and the first cover pattern is electrically connected to the ground line or floated.

Embodiments of the inventive concept provide an apparatus comprising a display module comprising an active area and a peripheral area, wherein the active area comprises a hole extending through the display module; a cover portion surrounding the hole; a plurality of sensing electrodes disposed in the active area; a dummy electrode disposed in the active area; and a ground line disposed in the peripheral area and electrically connected to the cover portion through the dummy electrode. In some cases, the dummy electrode is configured to prevent accumulation of charge on the cover portion. In some examples, the apparatus may further include a camera module extending at least partially through the hole.

According to the above, the cover portion is electrically connected to the ground line. Electric charges generated during processes are discharged through the ground line without accumulating on the cover portion. Accordingly, the electric charges may be prevented from accumulating on the cover portion, and the destruction of peripheral elements such as the first sensing pattern or the second sensing pattern, which is caused when a static electricity is suddenly discharged, may be prevented.

BRIEF DESCRIPTION OF THE DRAWINGS

The above and other advantages of the present disclosure will become readily apparent by reference to the following detailed description when considered in conjunction with the accompanying drawings wherein:

FIG. 8A is an enlarged plan view showing a portion CC' of FIG. 6;

FIG. 8B is a cross-sectional view taken along a line II' of FIG. 8A;

FIG. 14 is an enlarged plan view showing a portion FF' of FIG. 13.

DETAILED DESCRIPTION

Figure 1:
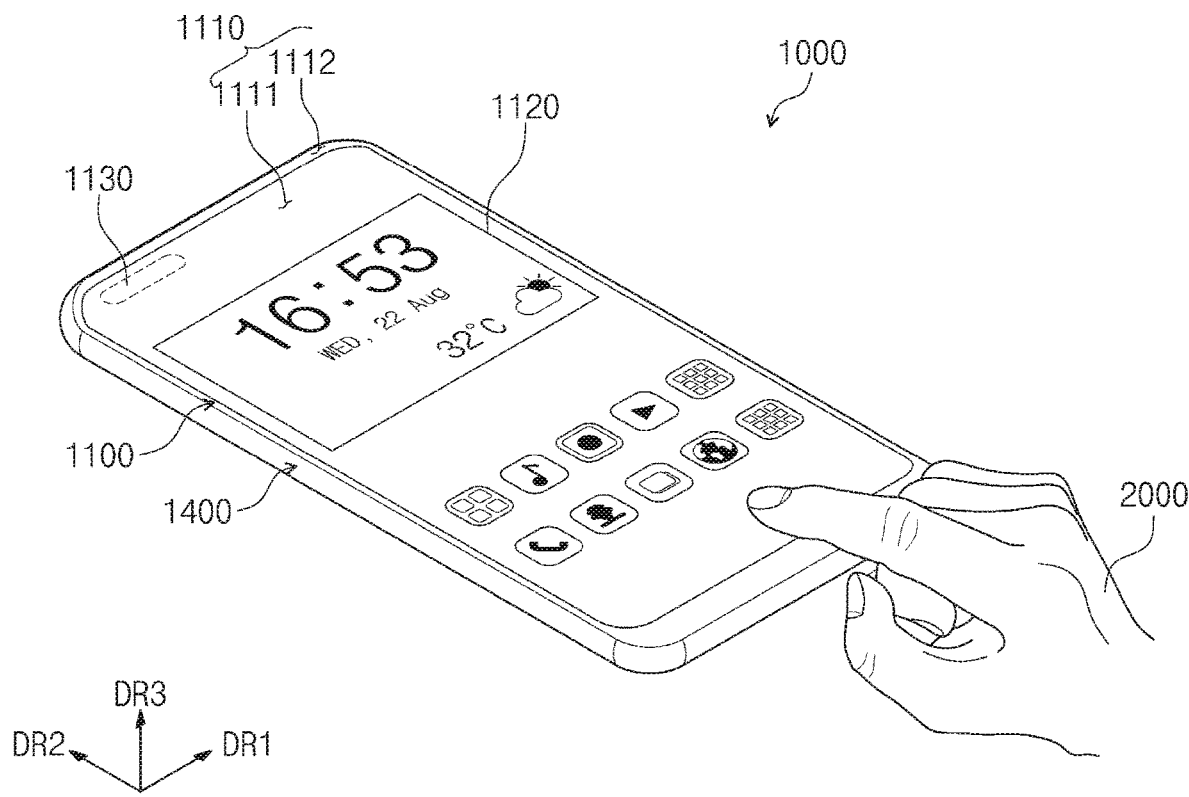
FIG. 1 is a perspective view showing an electronic apparatus according to an exemplary embodiment of the present disclosure.

The present disclosure relates to an electronic apparatus. Embodiments of the present disclosure provide systems and methods for preventing damage to an electronic apparatus by avoiding the buildup of static electricity.

According to some embodiments, the electronic device may include various electronic components such as an input sensor that senses an external input. The components of the electronic apparatus are electrically connected to each other by signal lines. The input sensor may include sensing electrodes to sense the external input. Additional electronic modules may include a camera, an infrared sensor, or a proximity sensor. The electronic module may be disposed under the input sensor. In some examples, the input sensor has a hole that exposes the electronic module.

Embodiments of the present disclosure present a cover portion electrically connected to a ground line. Electric charge may be discharged through the ground line rather than being directed to the cover portion. Accordingly, the electric charge may be prevented from accumulating on the cover portion of the electronic apparatus, and damage to peripheral elements, caused when a static electricity is suddenly discharged, may be prevented.

In the present disclosure, it will be understood that when an element or layer is referred to as being "on", "connected to" or "coupled to" another element or layer, the element or layer can be directly on, connected or coupled to the other element or layer or intervening elements or layers may be present.

Like numerals refer to like elements throughout the disclosure. In the drawings, the thickness, ratio, and dimension of components may be exaggerated for an effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are used to distinguish one element, component, region, layer, or section from another region, layer, or section. Therefore, a first element, component, region, layer, or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted with a meaning consistent with the term's meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 2:
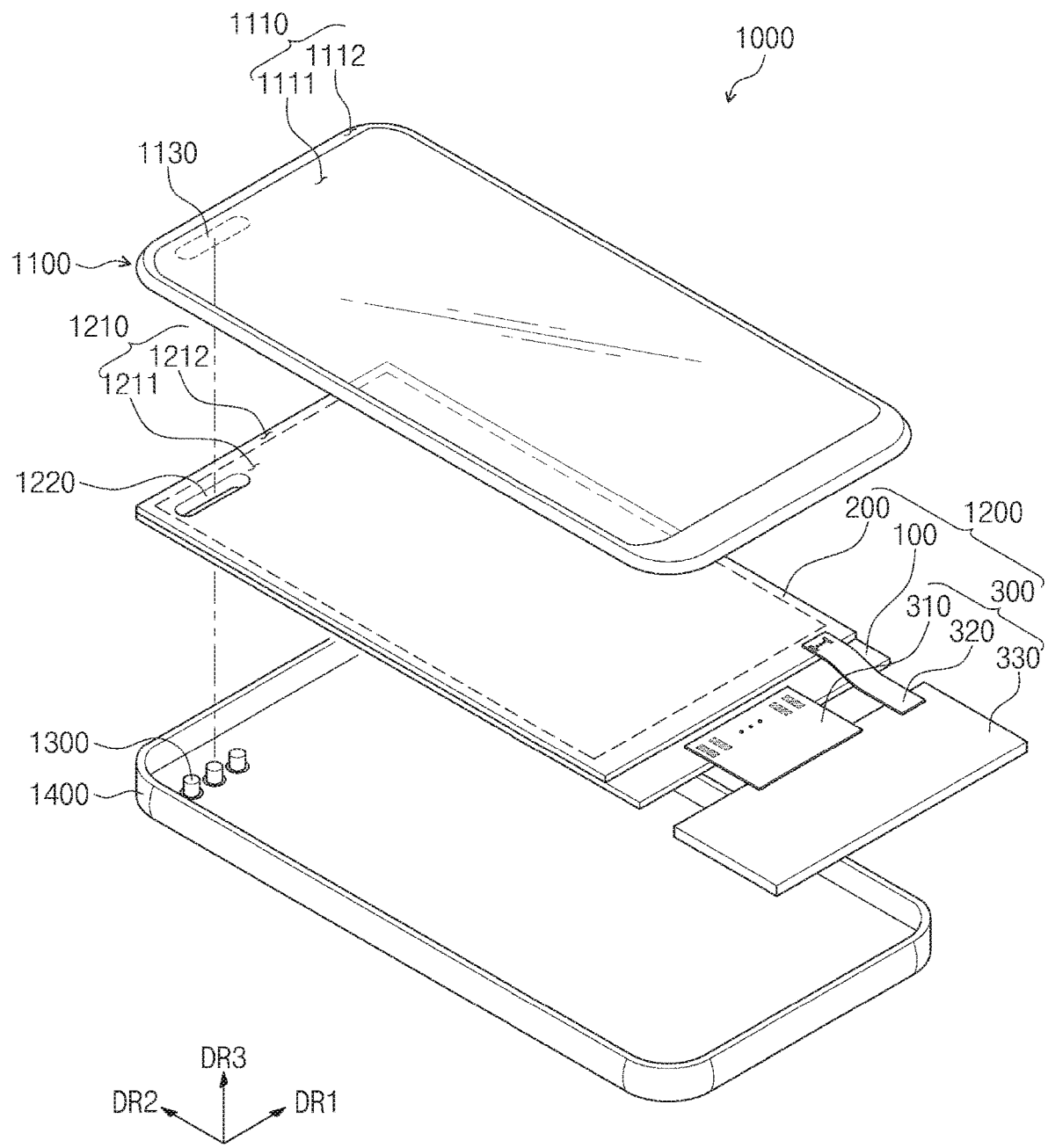
FIG. 2 is an exploded perspective view showing an electronic apparatus according to an exemplary embodiment of the present disclosure.

FIG. 1 is a perspective view showing an electronic apparatus 1000 according to an exemplary embodiment of the present disclosure. FIG. 2 is an exploded perspective view showing the electronic apparatus 1000 according to an exemplary embodiment of the present disclosure.

Referring to FIGS. 1 and 2, the electronic apparatus 1000 may be an apparatus activated in response to an electrical signal. The electronic apparatus 1000 may be applied to a large-sized electronic item, such as a television set and/or a monitor, and a small and medium-sized electronic device, such as a mobile phone, a tablet computer, a car navigation unit, a game unit, and a smartwatch. In the present exemplary embodiment, a smartphone will be described as a representative example of the electronic apparatus 1000.

The electronic apparatus 1000 displays an image 1120 through a display surface 1110, which is substantially parallel to each of a first direction DR1 and a second direction DR2, toward a third direction DR3. The display surface 1110, through which the image 1120 is displayed, corresponds to a front surface of the electronic apparatus 1000 and a display surface 1110 of a window 1100. Hereinafter, the display surface and the front surface of the electronic apparatus 1000 and the front surface of the window 1100 are assigned with the same reference numerals as each other.

In the present exemplary embodiment, front (or upper) and rear (or lower) surfaces of each member are defined with respect to a direction in which the image 1120 is displayed. The front and rear surfaces face each other in the third direction DR3. A normal line direction of each of the front and rear surfaces is substantially parallel to the third direction DR3.

The electronic apparatus 1000 includes the window 1100, a display module 1200, electronic modules 1300, and a housing 1400. In the present exemplary embodiment, the window 1100 and the housing 1400 are coupled to each other to provide an appearance of the electronic apparatus 1000.

The window 1100 includes an optically transparent insulating material. For example, the window 1100 includes a glass or plastic material. The window 1100 has a single-layer or multi-layer structure. As an example, the window 1100 includes a plurality of plastic films attached to each other by an adhesive or a glass substrate and a plastic film attached to the glass substrate by an adhesive.

The window 1100 is divided into a transmissive area 1111 and a bezel area 1112 in a plan view. In the following descriptions, the expression "in a plan view" may mean a state of being viewed in the third direction DR3. Additionally or alternatively, the expression "thickness direction" may mean the third direction RD3.

The transmissive area 1111 is an optically transparent area. For example, the bezel area 1112 is an area with a relatively lower transmittance than the transmissive area 1111. The bezel area 1112 defines a shape of the transmissive area 1111. The bezel area 1112 is disposed adjacent to the transmissive area 1111 and surrounds the transmissive area 1111.

The bezel area 1112 has a predetermined color. The bezel area 1112 covers a peripheral area 1212 of the display module 1200 to prevent the peripheral area 1212 from being viewed from the outside. However, this is merely exemplary, and the bezel area 1112 may be omitted from the window 1100 according to the exemplary embodiment of the present disclosure.

In the exemplary embodiment of the present disclosure, a sensor area 1130 overlaps the electronic modules 1300 described later. According to the present disclosure, the sensor area 1130 is defined to overlap the transmissive area 1111. Accordingly, a separate area provided to define the sensor area 1130 in an area rather than the transmissive area 1111 may be omitted. Therefore, a size of the bezel area 1112 may be reduced.

Figure 5:
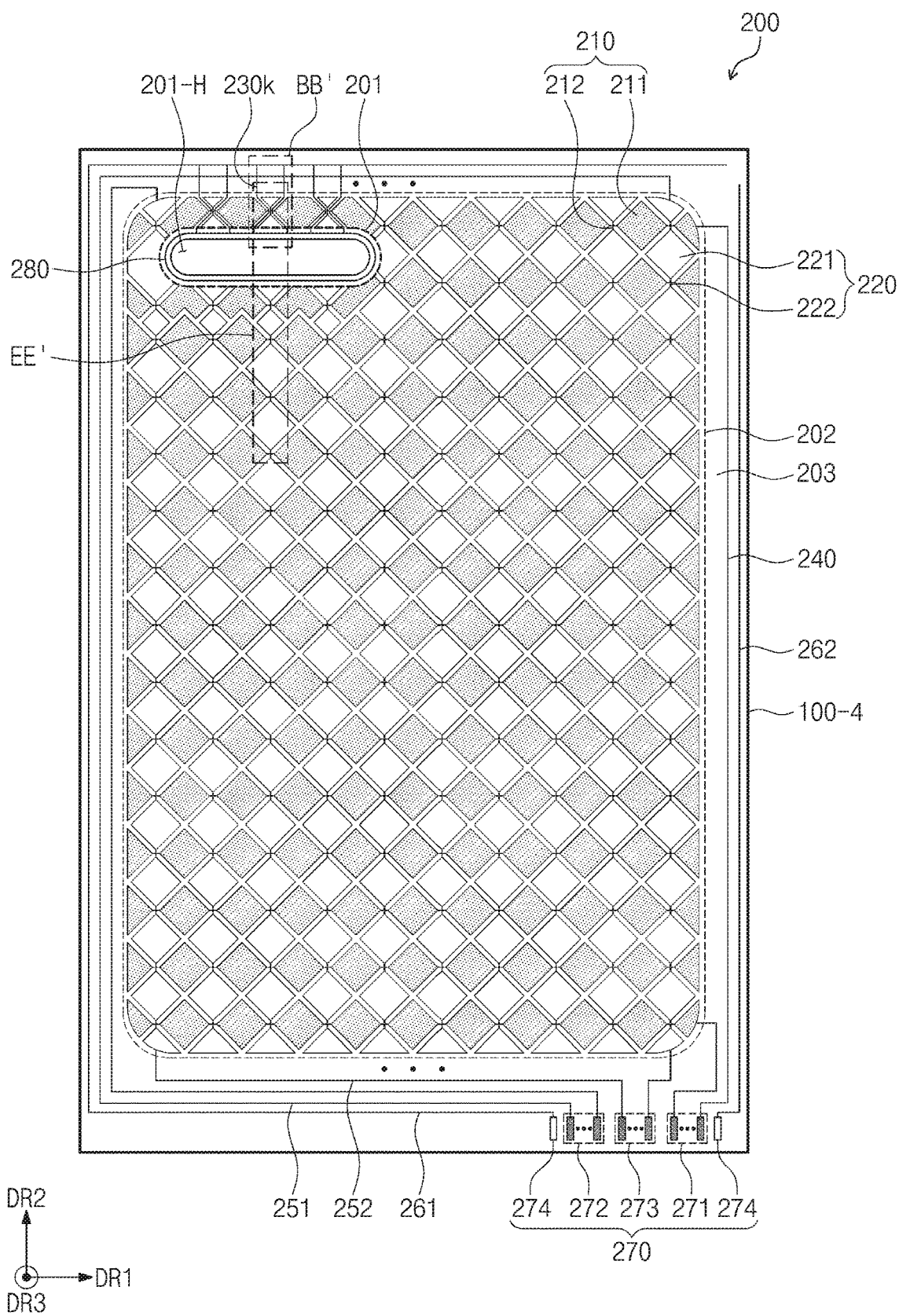
FIG. 5 is a plan view showing an input sensor according to an exemplary embodiment of the present disclosure.

Accordingly, embodiments of the inventive concept provide an apparatus comprising a display module 1200 comprising an active area 1211 and a peripheral area 1212, wherein the active area 1211 comprises a hole 1220 extending through the display module 1200; a cover portion (e.g., cover portion 280 of FIGS. 5 and 6) surrounding the hole 1220; a plurality of sensing electrodes (e.g., first sensing electrodes 210 and second sensing electrodes 220 of FIG. 5) disposed in the active area 1211; a dummy electrode (e.g., dummy electrode 230 of FIG. 5) disposed in the active area; and a ground line (e.g., ground lines 261 and 262 of FIGS. 5 and 6) disposed in the peripheral area 1212 and electrically connected to the cover portion 280 through the dummy electrode 230. In some cases, the dummy electrode 230 is configured to prevent accumulation of charge on the cover portion 280. In some examples, the apparatus may further include a camera module extending at least partially through the hole 1220.

FIG. 2 shows one sensor area 1130 as a representative example. However, the present disclosure should not be limited thereto or thereby. For example, the sensor area 1130 is defined in two or more. Additionally or alternatively, FIG. 2 shows the sensor area 1130 defined at an upper left portion of the transmissive area 1111 as a representative example. However, the sensor area 1130 may be defined at a portion of the transmissive area 1111 (e.g., an upper right portion), at an upper center of the transmissive area 1111, at a lower left portion of the transmissive area 1111, or at another portion of the transmissive area 1111 (e.g., a lower right portion).

The display module 1200 is disposed under the window 1100. In the present disclosure, the term "below" may mean a direction opposite to a direction in which the display module 1200 displays the image 1120. The display module 1200 displays the image 1120 and senses the external input. The display module 1200 includes a display surface 1210 in which an active area 1211 and the peripheral area 1212 are defined. The active area 1211 is activated in response to an electrical signal.

In the present exemplary embodiment, the active area 1211 is an area through which the image 1120 is displayed and the external input 2000 is sensed. The transmissive area 1111 overlaps at least the active area 1211. For example, the transmissive area 1111 overlaps an entire surface or at least a portion of the active area 1211. Accordingly, a user perceives the image 1120 or provides the external input 2000 through the transmissive area 1111.

The peripheral area 1212 is covered by the bezel area 1112. The peripheral area 1212 is disposed adjacent to the active area 1211. The peripheral area 1212 surrounds the active area 1211. A driving circuit or a driving line is disposed in the peripheral area 1212 to drive the active area 1211.

The display module 1200 includes a display panel 100, an input sensor 200, and a driving circuit 300.

The display panel 100 includes configurations appropriate to generate the image 1120. The image 1120 generated by the display panel 100 is displayed through the display surface 1210 and perceived by the user through the transmissive area 1111.

The input sensor 200 senses the external input 2000 applied from the outside. For example, the input sensor 200 senses the external input 2000 applied to the window 1100. The external input 2000 is a user's input. The user's input may include a variety of external inputs, such as a part of user's body, light, heat, pen, or pressure. In the present exemplary embodiment, the external input 2000 is shown by a user's hand touching the display surface 1110. However, this is merely exemplary. As described above, the external input 2000 may be provided in various forms. Additionally or alternatively, the external input 2000 applied to a side surface or a rear surface of the electronic apparatus 1000 may be sensed, depending on the structure of the electronic apparatus 1000. However, the external input 2000 should not be particularly limited.

The driving circuit 300 is electrically connected to the display panel 100 and the input sensor 200. The driving circuit 300 includes a first flexible film 310, a second flexible film 320, and a main circuit board 330.

The first flexible film 310 is electrically connected to the display panel 100. The first flexible film 310 connects the display panel 100 and the main circuit board 330. The first flexible film 310 is connected to pads (display pads) of the display panel 100, which are disposed in the peripheral area 1212. Additionally or alternatively, the first flexible film 310 provides electrical signals to the display panel 100 to drive the display panel 100. The electrical signals are generated by the first flexible film 310 or the main circuit board 330.

The second flexible film 320 is electrically connected to the input sensor 200. The second flexible film 320 connects the input sensor 200 and the main circuit board 330. The second flexible film 320 is connected to pads (sensing pads) of the input sensor 200, which are disposed in the peripheral area 1212. The second flexible film 320 provides electrical signals to the input sensor 200 to drive the input sensor 200. The electrical signals are generated by the second flexible film 320 or the main circuit board 330.

The main circuit board 330 includes various driving circuits to drive the display panel 100 and the input sensor 200 or a connector to provide a power. The first and second flexible films 310 and 320 are connected to the main circuit board 330. According to embodiments of the present disclosure, the display panel 100 and the input sensor 200 are controlled by using one main circuit board 330. However, this example merely exemplary. In the display module 1200 according to an exemplary embodiment of the present disclosure, the display panel 100 and the input sensor 200 may be connected to different main circuit boards, and one of the first and second flexible films 310 and 320 may not be connected to the main circuit board 330. However, the display panel 100 and the input sensor 200 should not be limited to a particular embodiment.

In the exemplary embodiment of the present disclosure, a predetermined hole 1220 (hereinafter, referred to as a "module hole") is defined in an area of the display module 1200, which corresponds to the sensor area 1130. The module hole 1220 is defined in an active area 1211 and penetrates through the display module 1200. Some areas of the display panel 100 and the input sensor 200 are penetrated by the module hole 1220. For example, the module hole 1220 is defined by removing at least a portion of components, which are disposed to overlap the sensor area 1130, of the display panel 100, and the input sensor 200. As the module hole 1220 is defined in the active area 1211, a size of the peripheral area 1212 may be reduced.

When viewed in a plan view, the electronic modules 1300 overlaps the module hole 1220 and the sensor area 1130. The electronic modules 1300 is disposed under the display module 1200. At least a portion of each of the electronic modules 1300 is accommodated in the module hole 1220. The electronic modules 1300 receive the external input applied thereto through the sensor area 1130. Additionally or alternatively, the electronic modules 1300 may provide outputs through the sensor area 1130.

In the exemplary embodiment of the present disclosure, three electronic modules 1300 are shown. However, the number of the electronic modules 1300 should not be limited to three. The electronic modules 1300 may include a camera module. However, the electronic modules 1300 are not limited to a camera module. The electronic modules 1300 may also include a light-emitting module, a light-receiving module, or a thermal sensing module.

The housing 1400 is coupled to the window 1100. The housing 1400 is coupled to the window 1100 to provide an inner space. The display module 1200 and the electronic modules 1300 are accommodated in the inner space.

The housing 1400 has a material with relatively high rigidity. For example, the housing 1400 includes glass, plastic, or metal material or a plurality of frames and/or plates of combinations thereof. The housing 1400 stably protects the components of the electronic apparatus 1000 accommodated in the inner space from external impacts.

Figure 3:
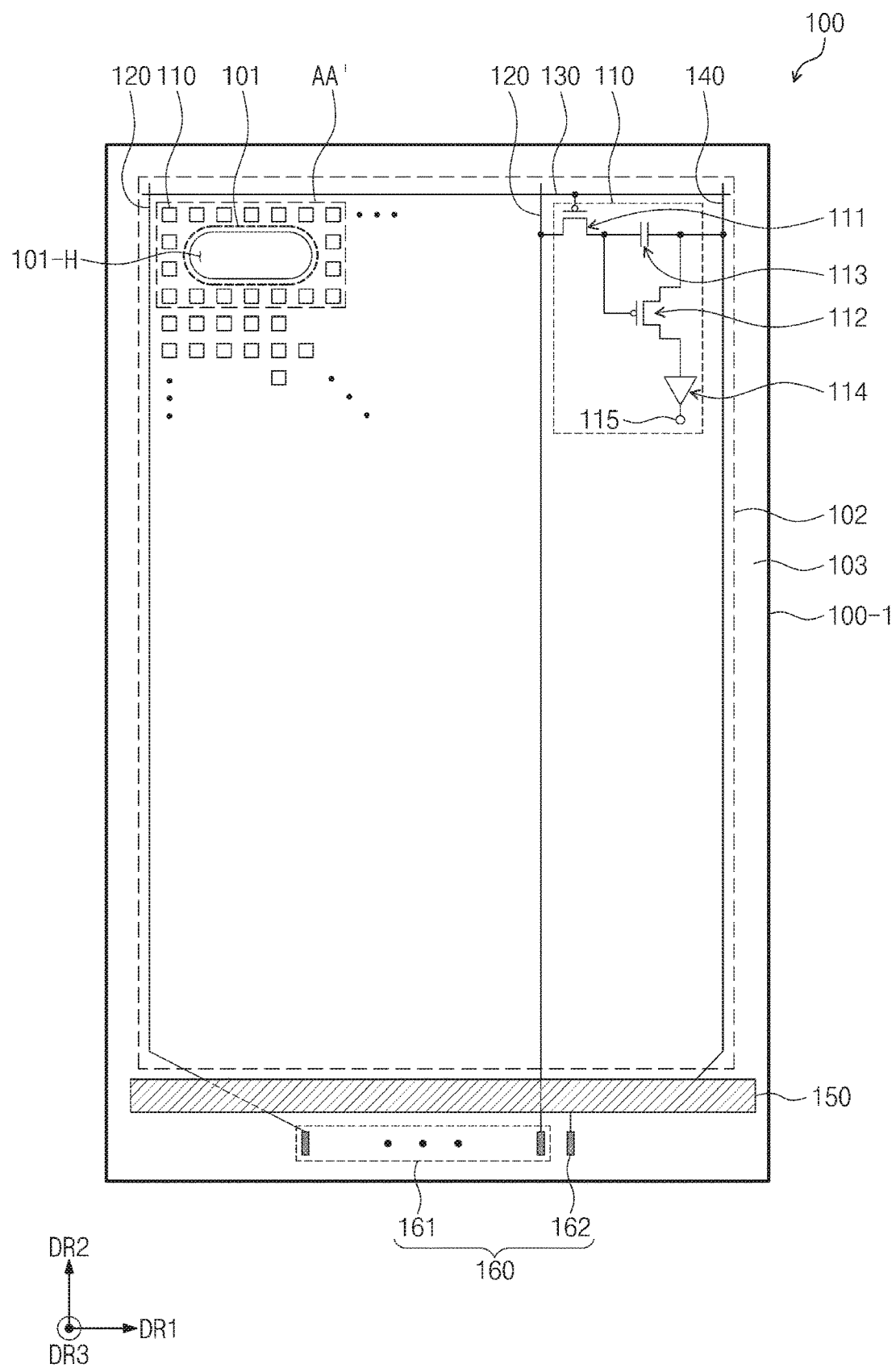
FIG. 3 is a plan view showing a display panel according to an exemplary embodiment of the present disclosure.
Figure 4:
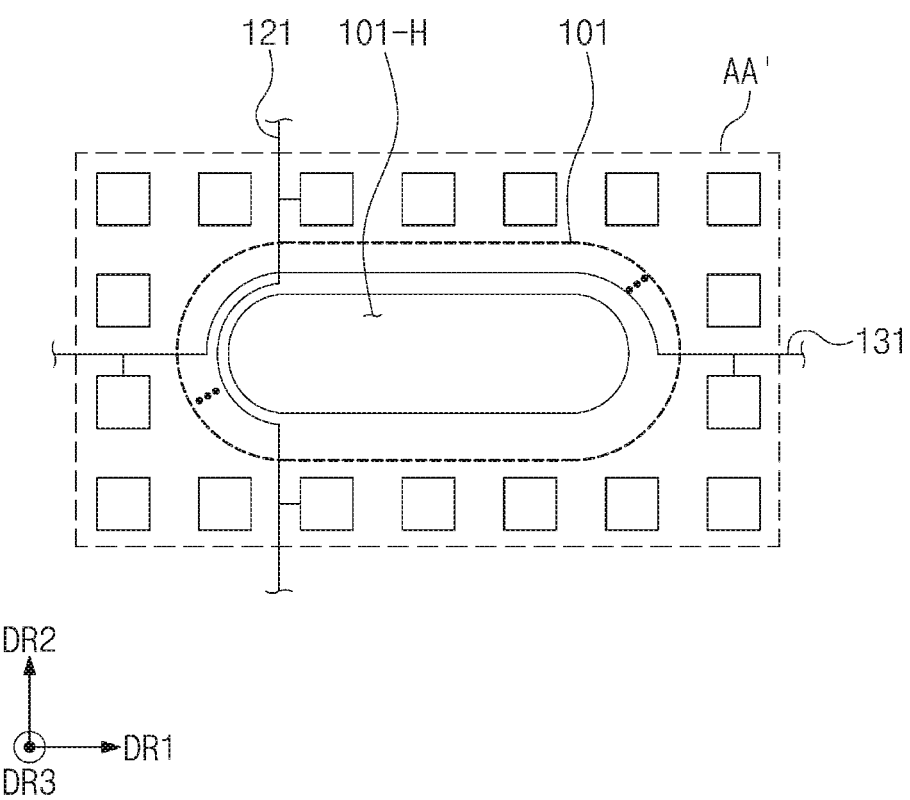
FIG. 4 is an enlarged view showing a portion AA' of FIG. 3.

FIG. 3 is a plan view showing the display panel 100 according to an exemplary embodiment of the present disclosure. FIG. 4 is an enlarged view showing a portion AA' of FIG. 3.

Referring to FIGS. 3 and 4, the display panel 100 includes a base substrate 100-1, a plurality of pixels 110, a plurality of signal lines 120, 130, and 140, a power pattern 150, and a plurality of display pads 160.

The base substrate 100-1 includes an insulating substrate. For example, the base substrate 100-1 includes a glass substrate, a plastic substrate, or a combination thereof. The base substrate 100-1 may be referred to as a "display base substrate".

The base substrate 100-1 includes a first area 101, a second area 102, and a third area 103, which are defined therein. A hole 101-H is defined in the first area 101, and the first area 101 surrounds the hole 101-H. In one example, the first area 101 surrounds the hole 101-H on every side in a plane (e.g., a plane parallel to the base substrate 100-4). In another example, the first area 101 surrounds the hole 101-H on at least three sides in the plane.

The second area 102 surrounds the first area 101. In one example, the second area 102 surrounds the first area 101 on every side in the plane. In another example, the second area 102 surrounds the first area 101 on at least three sides in the plane.

Additionally or alternatively, the third area 103 surrounds the second area 102 and the first area 101 overlaps the sensor area 1130 (refer to FIG. 1). In one example, the third area 103 surrounds the second area 102 on every side in the plane. In another example, the third area 103 surrounds the second area 102 on at least three sides in the plane. The second area 102 may be included in the active area 1211 (refer to FIG. 2). The third area 103 may be included in the peripheral area 1212 (refer to FIG. 2).

The signal lines 120, 130, and 140 are connected to the pixels 110 to transmit the electrical signals to the pixels 110. In FIG. 3, the signal lines 120, 130, and 140 including a data line 120, a scan line 130, and a power line 140 are shown as a representative example. However, these are merely exemplary. The signal lines 120, 130, and 140 may further include one of an initialization voltage line and a light-emitting control line. The signal lines should not be limited to a particular embodiment.

The pixels 110 are disposed on the second area 102. In the present exemplary embodiment, an equivalent circuit diagram of pixel 110 is shown as a representative example. The pixel 110 includes a first thin film transistor 111, a second thin film transistor 112, a capacitor 113, and a light-emitting device 114. The first thin film transistor 111 is a switching device that controls an on-off of the pixel 110. The first thin film transistor 111 transmits or blocks a data applied thereto through the data line 120 in response to a scan signal applied thereto through the scan line 130.

The capacitor 113 is connected to the power line 140 and the first thin film transistor 111. The capacitor 113 is charged with an electric charge by an amount corresponding to a difference between the data signal transmitted from the first thin film transistor 111 and a first power signal applied to the power line 140.

The second thin film transistor 112 is connected to the first thin film transistor 111, the capacitor 113, and the light-emitting device 114. The second thin film transistor 112 controls a driving current flowing through the light-emitting device 114 in response to the amount of the electric charge charged in the capacitor 113. A turn-on time of the second thin film transistor 112 is determined in accordance with the amount of the electric charge charged in the capacitor 113. The second thin film transistor 112 provides the first power signal applied thereto through the power line 140 to the light-emitting device 114.

The light-emitting device 114 generates a light or controls an amount of the light in response to electrical signals. For example, the light-emitting device 114 includes an organic light-emitting device or a quantum dot light-emitting device.

The light-emitting device 114 is connected to a power terminal 115 and receives a power signal (hereinafter, referred to as a "second power signal") different from the first power signal provided through the power line 140. The driving current corresponding to a difference between an electrical signal provided from the second thin film transistor 112 and the second power signal flows through the light-emitting device 114, and the light-emitting device 114 generates the light corresponding to the driving current. Meanwhile, this is merely exemplary, and the pixel 110 may include electronic elements with various configurations and arrangements. However, the pixel 110 should not be particularly limited.

As described above, the hole 101-H is surrounded by the active area 1211 (refer to FIG. 2). Accordingly, at least some of the pixels 110 are arranged adjacent to the hole 101-H. Some pixels of the pixels 110 surround the hole 101-H.

A plurality of signal lines 121 and 131 connected to the pixels 110 is disposed above the first area 101. The signal lines 121 and 131 are connected to the pixels 110 via the first area 101. For the convenience of explanation, FIG. 4 shows a first signal line 121 and a second signal line 131 among the signal lines connected to the pixels 110 as a representative example.

The first signal line 121 extends in the second direction DR2. The first signal line 121 is connected to the pixels 110 arranged in the same column in the second direction DR2 among the pixels 110. The first signal line 121 is described as corresponding to the data line 120.

Some of the pixels 110 connected to the first signal line 121 are disposed at an upper side with respect to the hole 101-H. The other pixels 110 connected to the first signal line 121 are disposed at a lower side with respect to the hole 101-H. Accordingly, the pixels 110 arranged in the same column and connected to the first signal line 121 receive the data signal through the same line even though some pixels 110 are removed by forming the hole 101-H.

The second signal line 131 extends in the first direction DR1. The second signal line 131 is connected to the pixels 110 arranged in the same row in the first direction DR1 among the pixels 110. The second signal line 131 is described as corresponding to the scan line 130.

Some pixels 110 of the pixels 110 connected to the second signal line 131 are disposed at a left portion of the second area 102 with respect to the hole 101-H. The other pixels 110 connected to the second signal line 131 are disposed at a right portion of the second area 102 with respect to the hole 101-H. Accordingly, the pixels 110 arranged in the same row and connected to the second signal line 131 are turned on and off by substantially the same gate signal even though some pixels 110 are removed by forming the hole 101-H.

Referring to FIG. 3 again, the power pattern 150 is disposed in the third area 103. The power pattern 150 is electrically connected to the power lines 140. The display panel 100 includes the power pattern 150. Therefore, the display panel 100 provides the first power signal with substantially the same level to the pixels 110.

The display pads 160 include a first pad 161 and a second pad 162. The first pad 161 is provided in plural, and the first pads 161 are respectively connected to the data lines 120. The second pad 162 is connected to the power pattern 150 and electrically connected to the power line 140. The display panel 100 provides electrical signals applied thereto through the display pads 160 from the outside to the pixels 110. Additionally or alternatively, the display pads 160 further include pads to receive other electrical signals in addition to the first pad 161 and the second pad 162. However, the display pads 160 should not be particularly limited.

Figure 6:
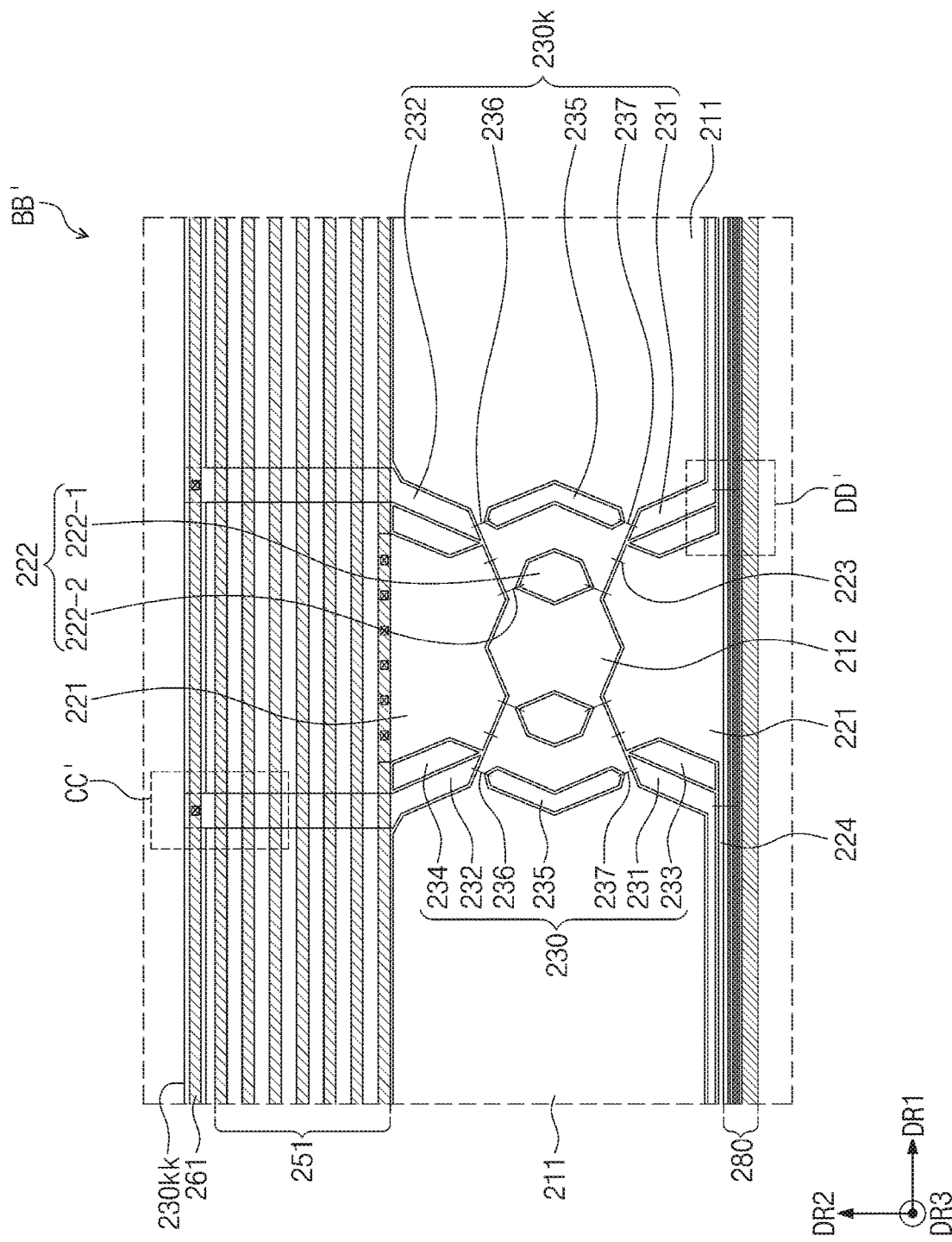
FIG. 6 is an enlarged plan view showing a portion BB' shown in FIG. 5.

FIG. 5 is a plan view showing an input sensor 200 according to an exemplary embodiment of the present disclosure. FIG. 6 is an enlarged plan view showing a portion BB' shown in FIG. 5.

Referring to FIGS. 5 and 6, the input sensor 200 includes a base substrate 100-4, first sensing electrodes 210, second sensing electrodes 220, a dummy electrode 230, first sensing lines 240, second sensing lines 251 and 252, ground lines 261 and 262, sensing pads 270, and a cover portion 280.

The base substrate 100-4 includes an insulating substrate. For example, the base substrate 100-4 includes a glass substrate, a plastic substrate, or a combination thereof.

The base substrate 100-4 includes a first area 201, a second area 202, and a third area 203, which are defined therein. A hole 201-H is defined in the first area 201, and the first area 201 surrounds the hole 201-H. The second area 202 surrounds the first area 201. The third area 203 surrounds the second area 202. The first area 201 overlaps the sensor area 1130 (refer to FIG. 1). The second area 202 is included in the active area 1211 (refer to FIG. 2). The third area 203 is included in the peripheral area 1212 (refer to FIG. 2).

The hole 201-H overlaps the hole 101-H, and the holes 101-H and 201-H form the module hole 1220 (refer to FIG. 2).

The first sensing electrodes 210, the second sensing electrodes 220, and the dummy electrode 230 are disposed in the second area 202. The input sensor 200 obtains information about the external input 2000 (refer to FIG. 1) based on a variation in capacitance between the first sensing electrodes 210 and the second sensing electrodes 220.

The first sensing electrodes 210 extend in the first direction DR1 and are arranged in the second direction DR2. The first sensing electrodes 210 include first sensing patterns 211 and connection patterns 212. The connection patterns 212 electrically connect two first sensing patterns 211 adjacent to each other. The first sensing patterns 211 and the connection patterns 212 are disposed on the same layer and include the same material. Additionally or alternatively, the first sensing patterns 211 and the connection patterns 212 have an integral shape. The first sensing patterns 211 may be referred to as first portions. The connection patterns 212 may be referred to as second portions.

The second sensing electrodes 220 extend in the second direction DR2 and are arranged in the first direction DR1. The second sensing electrodes 220 include second sensing patterns 221 and connection units 222. The connection units 222 may be referred to as connection members, bridge units, or bridge members.

Each of the connection units 222 includes island patterns 222-1 and bridge pattern 222-2. For example, each of the connection units 222 includes two island patterns 222-1 and four bridge patterns 222-2.

The island patterns 222-1 are disposed on the same layer as the second sensing patterns 221 and include the same materials as the second sensing patterns 221. Each of the island patterns 222-1 is surrounded by one first sensing electrode 210.

The bridge patterns 222-2 are insulated from the connection patterns 212 while crossing the connection patterns 212. For example, the bridge patterns 222-2 electrically connect one island pattern 222-1 and one second sensing pattern 221 spaced apart from the one island pattern 222-1.

Bypass patterns 223 are respectively and additionally connected to the second sensing patterns 221. Each of the bypass patterns 223 has a length shorter than a length of each of the bridge patterns 222-2. The bypass patterns 223 have a resistance lower than a resistance of the bridge patterns 222-2. Accordingly, when static electricity event occurs, the static electricity is concentrated at the bypass patterns 223 with the lower resistance. As a result, the bridge patterns 222-2 may be prevented from being damaged due to the static electricity.

The dummy electrode 230 is disposed between the first sensing electrodes 210 and the second sensing electrodes 220. The first sensing electrodes 210 and the second sensing electrodes 220 are spaced apart from each other, and the dummy electrode 230 is disposed in a spaced between the first sensing electrodes 210 and the second sensing electrodes 220. A difference in reflectance between an area in which the first sensing electrodes 210 and the second sensing electrodes 220 are disposed and an area in which the first sensing electrodes 210 and the second sensing electrodes 220 are not disposed is reduced due to the dummy electrode 230. Therefore, the first sensing electrodes 210 and the second sensing electrodes 220 are not viewed. Therefore, optical viewing characteristics may be increased.

The dummy electrode 230 includes a plurality of dummy patterns 231, 232, 233, 234, 235, 236, and 237. For example, the dummy electrode 230 includes a first dummy pattern 231, a second dummy pattern 232, a third dummy pattern 233, a fourth dummy pattern 234, a dummy island pattern 235, a first dummy bridge pattern 236, and a second dummy bridge pattern 237. As the dummy electrode 230 includes the plural patterns separated from each other, a touch sensitivity is increased.

The first dummy pattern 231 and the second dummy pattern 232 are disposed adjacent to the first sensing patterns 211, and the third dummy pattern 233 and the fourth dummy pattern 234 are disposed adjacent to the second sensing patterns 221. The dummy island pattern 235, the first dummy bridge pattern 236, and the second dummy bridge pattern 237 are electrically connected to each other.

The first sensing lines 240 and the second sensing lines 251 and 252 are disposed on the third area 203. The first sensing lines 240 are electrically connected to the first sensing electrodes 210, respectively. The second sensing lines 251 are electrically connected to one ends of the second sensing electrodes 220, respectively, and the second sensing lines 252 are electrically connected to the other ends of the second sensing electrodes 220, respectively.

The second sensing electrodes 220 have a relatively longer length than the first sensing electrodes 210. Accordingly, two second sensing lines 251 and 252 are electrically connected to the second sensing electrodes 220, respectively. Therefore, sensitivity of the second sensing electrodes 220 is uniformly maintained. Meanwhile, this is merely exemplary, and one of the second sensing lines 251 and 252, for example, the second sensing line 252, may be omitted.

Ground lines 261 and 262 are disposed in the third area 203. The ground lines 261 and 262 receive a ground voltage. For example, the electric charges are discharged through the ground lines 261 and 262. Therefore, device destruction due to electrostatic discharge may be prevented.

The sensing pads 270 are disposed in the third area 203. The sensing pads 270 include first sensing pads 271, second sensing pads 272, third sensing pads 273, and fourth sensing pads 274. The first sensing pads 271 are respectively connected to the first sensing lines 240. The second sensing pads 272 are respectively connected to the second sensing lines 251. The third sensing pads 273 are respectively connected to the second sensing lines 252. The fourth sensing pads 274 are respectively connected to the ground lines 261 and 262.

The cover portion 280 is disposed around the hole 201-H. For example, the cover portion 280 is disposed in the first area 201. In the exemplary embodiment of the present disclosure, the cover portion 280 is electrically connected to the ground line 261 through the dummy electrode 230. In this case, electric charges generated during processes are discharged through the ground line 261 without accumulating on the cover portion 280. Accordingly, since the electric charges accumulated on the cover portion 280 are discharged, peripheral elements, e.g., the first sensing pattern 211 or the second sensing pattern 221, may be prevented from being damaged. Additionally or alternatively, according to the exemplary embodiment of the present disclosure, the cover portion 280 and the ground line 261 are connected to each other using the dummy electrode 230.

In the exemplary embodiment of the present disclosure, the hole 201-H includes at least one straight-line portion. For example, the hole 201-H includes a first straight-line portion and a second straight-line portion, which extend in the first direction DR1 and are spaced apart from each other in the second direction DR2. Additionally or alternatively, the hole 201-H includes a first curved line portion connecting one end of the first straight-line portion to one end of the second straight-line portion and a second curved line portion connecting the other end of the first straight-line portion to the other end of the second straight-line portion. A width in the first direction DR1 of the hole 201-H is greater than a width in the second direction DR2 of the hole 201-H. The hole 201-H may be referred to as a "wide hole".

In the exemplary embodiment of the present disclosure, the cover portion 280 and the ground line 261 are electrically connected to each other through some of the dummy patterns 231, 232, 233, 234, 235, 236, and 237, wherein the dummy patterns 231, 232, 233, 234, 235, 236, and 237 may be disposed between the first straight-line portion and the ground line 261. Hereinafter, the dummy patterns electrically connecting the cover portion 280 to the ground line 261 are referred to as "conductive lines 230k". The first straight-line portion is defined closer to the third area 203 than the second straight-line portion is.

FIG. 5 shows the cover portion 280 electrically connected to the ground line 261 through six conductive lines 230k. However, the number of the conductive lines 230k should not be limited to six. The number of the conductive lines 230k may vary depending on a size of the hole 201-H and a position of the hole 201-H.

Each of the conductive lines 230k includes the first dummy pattern 231, the second dummy pattern 232, the dummy island pattern 235, the first dummy bridge pattern 236, and the second dummy bridge pattern 237.

The cover portion 280 is electrically connected to the first dummy pattern 231. The ground line 261 is electrically connected to the second dummy pattern 232. The second dummy pattern 232 extends in an area overlapping the ground line 261.

The dummy island pattern 235 is disposed between the first dummy pattern 231 and the second dummy pattern 232. The dummy island pattern 235 has substantially the same area as an area of each of the island pattern 222-1. Additionally or alternatively, sides forming the dummy island pattern 235 include sides substantially parallel to the sides forming each of the island patterns 222-1.

The first dummy bridge pattern 236 is connected to the second dummy pattern 232 and the dummy island pattern 235, and the second dummy bridge pattern 237 is connected to the first dummy pattern 231 and the dummy island pattern 235.

According to the exemplary embodiment of the present disclosure, the conductive lines 230k are connected to each other. For example, the conductive lines 230k are connected to a conductive connection line 230kk. The conductive connection line 230kk overlaps the ground line 261 and extends in the first direction DR1. Additionally or alternatively, according to another exemplary embodiment of the present disclosure, the conductive connection line 230kk may be omitted.

In FIG. 6, each of the conductive line 230k is connected to the ground line 261 through one contact hole. However, the present disclosure should not be limited thereto or thereby. The contact holes may be additionally provided in an area overlapping the conductive connection line 230kk, and the conductive connection line 230kk may electrically connect the ground line 261 through the contact holes.

Figure 7A:
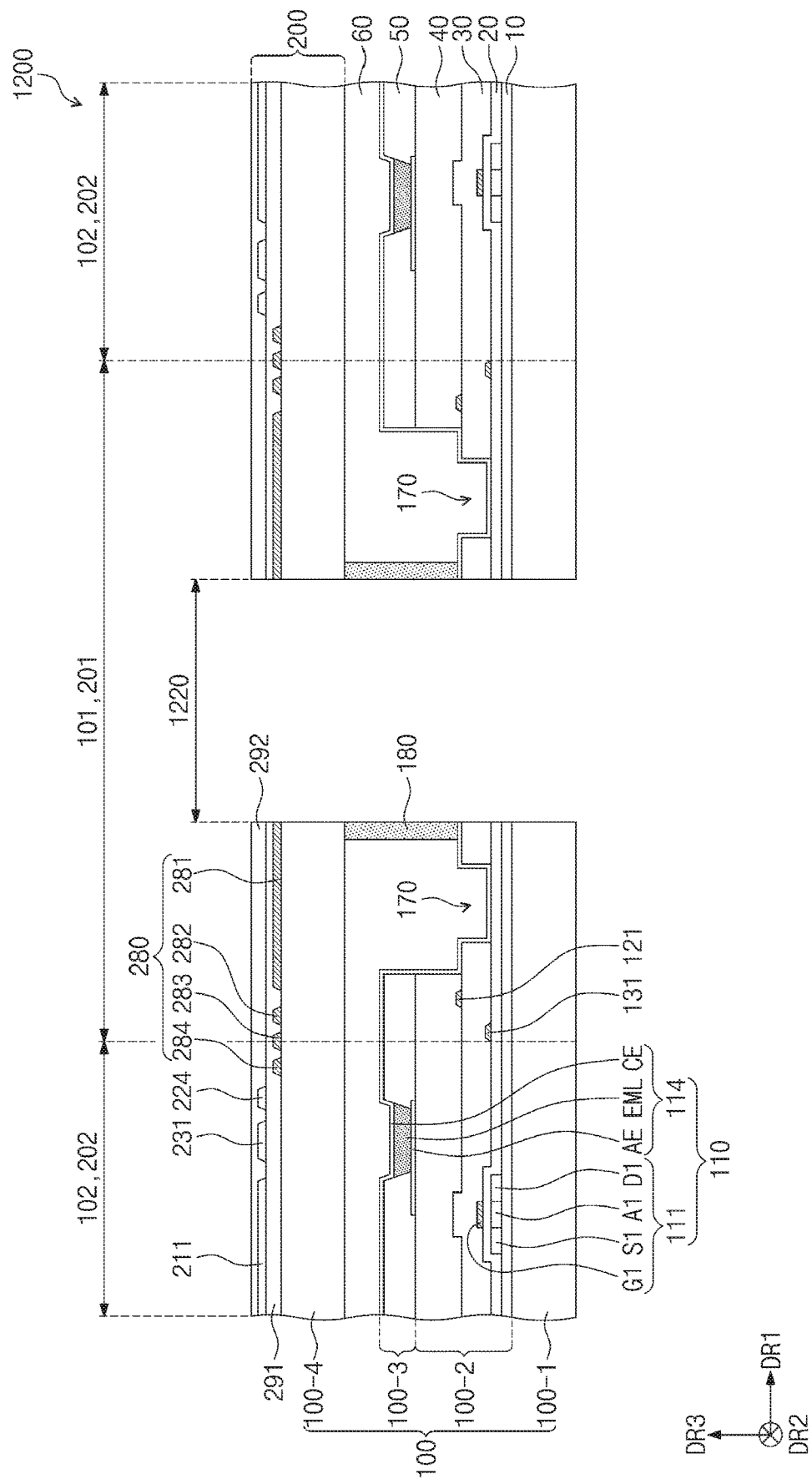
FIG. 7A is a cross-sectional view showing a display module according to an exemplary embodiment of the present disclosure.

FIG. 7A is a cross-sectional view showing the display module 1200 according to an exemplary embodiment of the present disclosure.

Referring to FIG. 7A, the display module 1200 includes the display panel 100 and the input sensor 200.

The display panel 100 includes the base substrate 100-1, a circuit layer 100-2, a display element layer 100-3, and a base substrate 100-4. The circuit layer 100-2 is disposed on the base substrate 100-1, the display element layer 100-3 is disposed on the circuit layer 100-2, and the base substrate 100-4 is disposed on the display element layer 100-3.

An auxiliary layer 10 is disposed on the base substrate 100-1 to cover a front surface of the base substrate 100-1. The auxiliary layer 10 includes an inorganic material. The auxiliary layer 10 includes a barrier layer and/or a buffer layer. Accordingly, the auxiliary layer 10 prevents oxygen or moisture introduced through the base substrate 100-1 from entering the pixel 110 or reduces a surface energy of the base substrate 100-1 such that the pixel 110 is formed on the base substrate 100-1. In some cases, the connection between the pixel 110 and the base substrate 100-1 may form a stable connection.

The pixel 110 is disposed on the second area 102. In the present exemplary embodiment, the first thin film transistor 111 and the light-emitting device 114 among the components of the equivalent circuit diagram of the pixel 110 shown in FIG. 3 are shown as a representative example.

The first thin film transistor 111 includes an active A1, a source S1, a drain D1, and a gate G1. The active A1, the source S1, and the drain D1 are provided by one semiconductor pattern.

For example, the semiconductor pattern is disposed on the auxiliary layer 10. The semiconductor pattern includes polysilicon. However, the semiconductor pattern may include amorphous silicon or metal oxide according to embodiments. The semiconductor pattern includes a doped region and a non-doped region. The doped region is doped with an N-type dopant or a P-type dopant. A P-type transistor includes a doped region doped with the P-type dopant. The doped region has a conductivity greater than that of the non-doped region and substantially serves as an electrode or signal line. The non-doped region substantially corresponds to the active (or channel). In other words, a portion of the semiconductor pattern may be the active A1 of the first thin film transistor 111, another portion of the semiconductor pattern may be the source S1 or the drain D1 of the first thin film transistor 111, and the other portion of the semiconductor pattern may be a connection electrode or a connection signal.

The first insulating layer 20 is disposed on the auxiliary layer 10 to cover the active A1, the source S1, and the drain D1. The first insulating layer 20 is an inorganic layer and/or an organic layer and has a single-layer or multi-layer structure. The first insulating layer 20 may include at least one of aluminum oxide, titanium oxide, silicon oxide, silicon oxynitride, zirconium oxide, and hafnium oxide. In the present exemplary embodiment, the first insulating layer 20 has a single-layer structure of a silicon oxide layer. An insulating layer of the circuit layer 100-2 described later is an inorganic layer and/or an organic layer. The insulating layer has a single-layer or multi-layer structure as well as the first insulating layer 20. The inorganic layer includes at least one of the above-mentioned materials.

The gate G1 is disposed on the first insulating layer 20. The gate G1 corresponds to a portion of a metal pattern. The gate G1 overlaps the active A1. The gate G1 is used as a mask in the process of doping the semiconductor pattern.

The second signal line 131 is disposed on the first insulating layer 20. Additionally or alternatively, the second signal line 131 is disposed in the first area 101.

The second insulating layer 30 is disposed on the first insulating layer 20 and covers the gate G1 and the second signal line 131. The second insulating layer 30 is an inorganic layer and/or an organic layer and has a single-layer or multi-layer structure. In the present exemplary embodiment, the second insulating layer 30 has a single-layer structure of silicon oxide.

The first signal line 121 is disposed on the second insulating layer 30. Additionally or alternatively, the first signal line 121 is disposed on the first area 101.

The third insulating layer 40 is disposed on the second insulating layer 30 and covers the first signal line 121.

The light-emitting device 114 is disposed on the third insulating layer 40. The light-emitting device 114 includes a first electrode AE, a light-emitting layer EML, and a second electrode CE.

The first electrode AE is electrically connected to the first thin film transistor 111. For example, the first electrode AE is electrically connected to the first thin film transistor 111 via the second thin film transistor 112 (refer to FIG. 3).

The fourth insulating layer 50 is disposed on the third insulating layer 40. The fourth insulating layer 50 includes an organic material and/or an inorganic material and has a single-layer or multi-layer structure. An opening is defined through the fourth insulating layer 50, and at least a portion of the first electrode AE is exposed through the opening. The fourth insulating layer 50 may be referred to as a "pixel definition layer".

The light-emitting layer EML is disposed on the first electrode AE exposed through the opening. The light-emitting layer EML includes a light-emitting material. The light-emitting layer EML may include at least one material among materials respectively emitting red, green, and blue lights. The light-emitting layer EML includes a fluorescent material or a phosphorescent material. The light-emitting layer EML includes an organic light-emitting material or an inorganic light-emitting material. The light-emitting layer EML emits the light in response to a difference in electric potential between the first electrode AE and a second electrode CE.

The second electrode CE is disposed on the light-emitting layer EML. The second electrode CE faces the first electrode AE. The second electrode CE is commonly disposed in the pixels 110. Each of the pixel 110 receives a common voltage (hereinafter, referred to as a "second power voltage") through the second electrode CE.

A recessed portion 170 is defined in the first area 101. The recessed portion 170 is provided to surround an edge of the module hole 1220. The recessed portion 170 blocks a path in which moisture or oxygen introduced through the module hole 1220 enters the pixel 110. The recessed portion 170 is defined by removing some portions of the components forming the display panel 100. For example, some portions of the second insulating layer 30, third insulating layer 40, and fourth insulating layers 50 are removed to provide the recessed portion 170, however, this is merely exemplary. According to an exemplary embodiment of the present disclosure, the recessed portion 170 may not be provided.

The base substrate 100-4 is disposed on the second electrode CE. The base substrate 100-4 is spaced apart from the second electrode CE. A space 60 between the base substrate 100-4 and the second electrode CE is filled with air or inert gas. Additionally or alternatively, in the exemplary embodiment of the present disclosure, the space 60 may be filled with a filler, such as a silicon-based polymer, an epoxy-based resin, or an acrylic-based resin.

The base substrate 100-4 is coupled to the base substrate 100-1 by a sealing member 180. The sealing member 180 defines an inner surface of the module hole 1220. The sealing member 180 includes an organic material, such as a light-curable resin or a light plastic resin, or an inorganic material such as a frit seal. However, the sealing member 180 should not be limited to a particular embodiment.

The input sensor 200 includes the base substrate 100-4, a plurality of conductive layers, and a plurality of insulating layers 291 and 292. In the exemplary embodiment of the present disclosure, the base substrate 100-4 is included in the input sensor 200 and the display panel 100. For example, the base substrate 100-4 may be an encapsulation substrate of the display panel 100 and may be a base substrate on which the components of the input sensor 200 are formed. In the exemplary embodiment of the present disclosure, the base substrate of the input sensor 200 may be provided as a separate component from the base substrate 100-4 of the display panel 100. In this case, an adhesive layer may be additionally disposed between the base substrate and the base substrate 100-4 of the display panel 100.

The first conductive layer is disposed on the base substrate 100-4. The first conductive layer includes the cover portion 280, the bridge patterns 222-2 (refer to FIG. 6), the bypass patterns 223 (refer to FIG. 6), the first sensing lines 240 (refer to FIG. 5), the second sensing lines 251 and 252 (refer to FIG. 5), the ground lines 261 and 262 (refer to FIG. 5), and the first and second dummy bridge patterns 236 and 237 (refer to FIG. 6).

The first conductive layer includes a metal material and has a single-layer or multi-layer structure. For example, the first conductive layer has the multi-layer structure in which titanium, aluminum, and titanium are sequentially stacked one on another. However, this is merely exemplary. The material for the first conductive layer should not be limited thereto or thereby.

A laser etching process is used to form the module hole 1220 through the display module 1200. The cover portion 280 is disposed adjacent to the area in which the module hole 1220 is formed to cover components disposed under the cover portion 280. For example, the cover portion 280 prevents the first signal line 121 and the second signal line 131 from being damaged by a laser beam.

The cover portion 280 includes a first cover pattern 281, a second cover pattern 282, a third cover pattern 283, and a fourth cover pattern 284, however, this is merely exemplary. The number of the cover patterns included in the cover portion 280 may be changed.

The first insulating layer 291 covers the first conductive layer. The first insulating layer 291 includes an organic material and/or an inorganic material and has a single-layer or multi-layer structure. In the exemplary embodiment of the present disclosure, the first insulating layer 291 has the single-layer structure of silicon oxide.

The second conductive layer is disposed on the first insulating layer 291. The second conductive layer includes the first sensing patterns 211, the connection patterns 212 (refer to FIG. 6), the second sensing patterns 221 (refer to FIG. 6), the island pattern 222-1 (refer to FIG. 6), the first dummy pattern 231 (refer to FIG. 6), the second dummy pattern 232 (refer to FIG. 6), the third dummy pattern 233 (refer to FIG. 6), the fourth dummy pattern 234 (refer to FIG. 6), and the dummy island pattern 235 (refer to FIG. 6).

The second conductive layer includes a transparent conductive oxide. For example, the second conductive layer includes at least one of indium tin oxide (ITO), indium zinc oxide (IZO), indium gallium oxide (IGO), indium gallium zinc oxide (IGZO), and mixtures/compounds thereof. However, the second conductive layer should not be limited thereto or thereby.

The second insulating layer 292 covers the second conductive layer. The second insulating layer 292 includes an organic material and/or an inorganic material and has a single-layer or multi-layer structure. In the exemplary embodiment of the present disclosure, the second insulating layer 292 has the single-layer structure of silicon oxide.

Figure 7B:
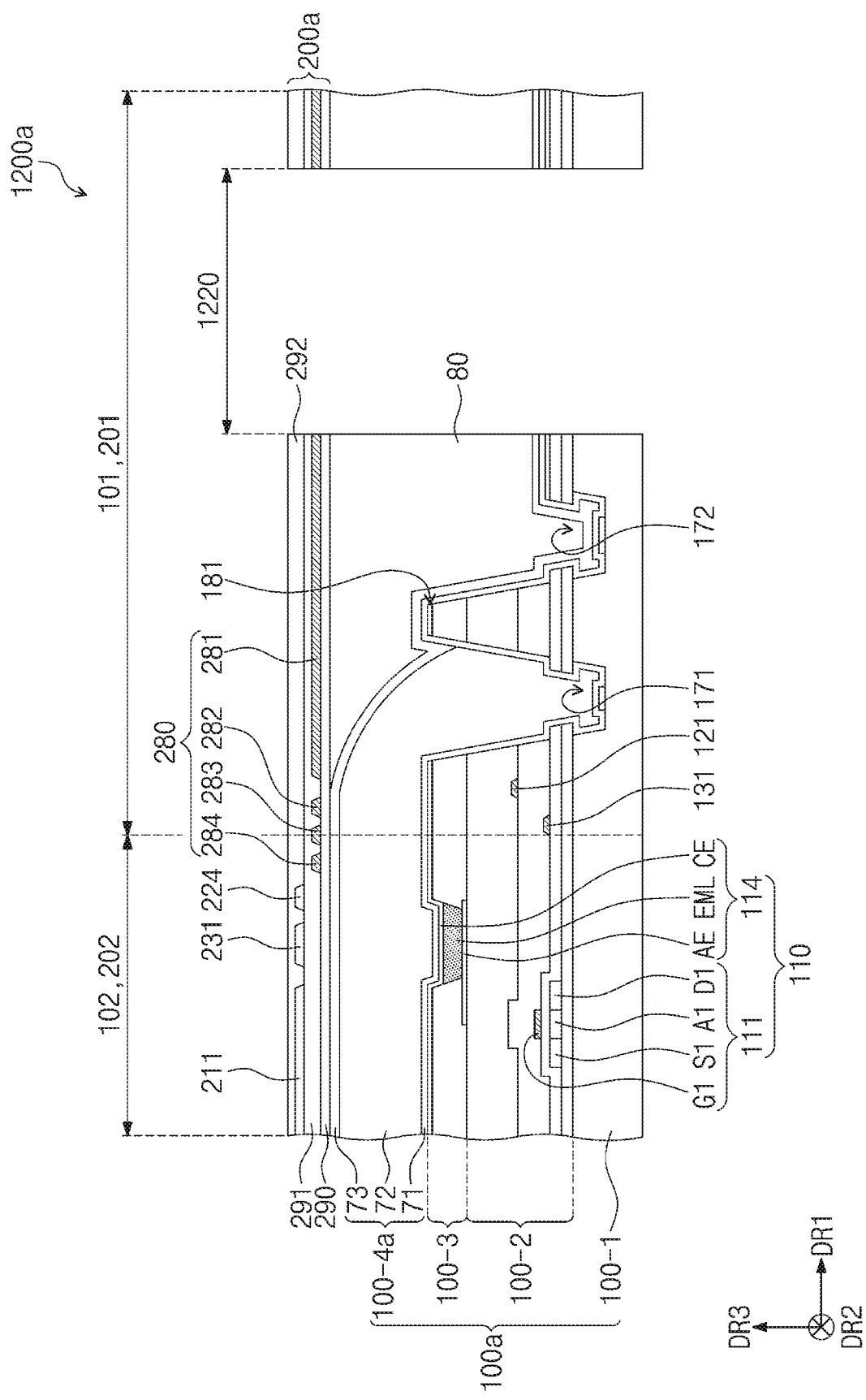
FIG. 7B is a cross-sectional view showing a display module according to an exemplary embodiment of the present disclosure.

FIG. 7B is a cross-sectional view showing a display module according to an exemplary embodiment of the present disclosure.

Referring to FIG. 7B, a display module 1200a includes a display panel 100a and an input sensor 200a.

The display panel 100a includes a base substrate 100-1, a circuit layer 100-2, a display element layer 100-3, and an encapsulation layer 100-4a. The circuit layer 100-2 is disposed on the base substrate 100-1, the display element layer 100-3 is disposed on the circuit layer 100-2, and the encapsulation layer 100-4a is disposed on the display element layer 100-3.

Recessed portions 171 and 172 are defined in the first area 101. Each of the recessed portions 171 and 172 may be defined to surround an edge of the module hole 1220. The recessed portions 171 and 172 block a path through which moisture or oxygen introduced through the module hole 1220 enters into the pixel 110. The recessed portions 171 and 172 are defined by removing some of the components forming the display panel 100a. FIG. 7B shows two recessed portions 171 and 172 as a representative example. However, the number of the recessed portions 171 and 172 should not be limited thereto or thereby.

A dam portion 181 is disposed between the recessed portions 171 and 172. FIG. 7B shows one dam portion 181 as a representative example. However, the number of the dam portions 181 should not be limited to one. The dam portion 181 has a stacked structure of predetermined insulating layers. However, the number of the insulating layers forming the dam portion 181 may be changed in various ways. The dam portion 181 prevents an organic layer 72 described below from expanding.

The encapsulation layer 100-4a is disposed on the display element layer 100-3 and encapsulates the light-emitting device 114. Meanwhile, although not shown in figures, a capping layer is further disposed between the second electrode CE and the encapsulation layer 100-4a to cover the second electrode CE.

The encapsulation layer 100-4a includes a first inorganic layer 71, an organic layer 72, and a second inorganic layer 73, which are sequentially stacked in the third direction DR3. However, the encapsulation layer 100-4a should not be limited thereto or thereby. The encapsulation layer 100-4a may further include a plurality of inorganic layers and a plurality of organic layers.

The first inorganic layer 71 covers the second electrode CE. The first inorganic layer 71 prevents external moisture or oxygen from entering the light-emitting device 114. For example, the first inorganic layer 71 includes silicon nitride, silicon oxide, or a combination thereof. A chemical vapor deposition process forms the first inorganic layer 71.

The organic layer 72 is disposed on the first inorganic layer 71 and makes contact with the first inorganic layer 71. The organic layer 72 provides a flat surface on the first inorganic layer 71. An uneven shape formed on the upper surface of the first inorganic layer 71 or particles on the first inorganic layer 71 is covered by the organic layer 72. Therefore, an influence of a surface state of the upper surface of the first inorganic layer 71, which is exerted on components formed on the organic layer 72, is blocked. Additionally or alternatively, the organic layer 72 relieves a stress between layers making contact with each other. The organic layer 72 includes an organic material and is formed by a solution process, such as a spin coating, a slit coating, or an inkjet process.

The second inorganic layer 73 is disposed on the organic layer 72 to cover the organic layer 72. The second inorganic layer 73 is stably formed on a relatively flat surface than being disposed on the first inorganic layer 71. The second inorganic layer 73 encapsulates moisture leaked from the organic layer 72 to prevent the moisture from flowing to the outside. The second inorganic layer 73 includes silicon nitride, silicon oxide, or a compound thereof. A chemical vapor deposition process forms the second inorganic layer 73.

The cover portion 80 is disposed in the first area 101. The cover portion 80 covers an uneven surface caused by the dam portion 181 or the recessed portions 171 and 172 and defines an even surface.

The input sensor 200a includes a plurality of insulating layers 290, 291, and 292 and a plurality of conductive layers. The insulating layers 290, 291, and 292 include abase insulating layer 290, a first insulating layer 291, and a second insulating layer 292.

The base insulating layer 290 is an inorganic layer containing one of silicon nitride, silicon oxynitride, and silicon oxide. Additionally or alternatively, the base insulating layer 290 is an organic layer containing an epoxy resin, an acryl resin, or an imide-based resin. The base insulating layer 290 is formed directly on the display panel 100a. The base insulating layer 290 has a single-layer or multi-layer structure.

The first conductive layer is disposed on the base insulating layer 290. The first conductive layer includes a cover portion 280, the bridge patterns 222-2 (refer to FIG. 6), the bypass patterns 223 (refer to FIG. 6), the first sensing lines 240 (refer FIG. 5), the second sensing lines 251 and 252 (refer to FIG. 5), the ground lines 261 and 262 (refer to FIG. 5), and the first and second dummy bridge patterns 236 and 237 (refer to FIG. 6).

The first insulating layer 291 covers the first conductive layer. Additionally or alternatively, the first insulating layer 291 includes an organic material and/or an inorganic material and has a single-layer or multi-layer structure.

The second conductive layer is disposed on the first insulating layer 291. The second conductive layer includes the first sensing patterns 211, the connection patterns 212 (refer to FIG. 6), the second sensing patterns 221 (refer to FIG. 6), the island patterns 222-1 (refer to FIG. 6), the first dummy pattern 231 (refer to FIG. 6), the second dummy pattern 232 (refer to FIG. 6), the third dummy pattern 233 (refer to FIG. 6), the fourth dummy pattern 234 (refer to FIG. 6), and the dummy island pattern 235 (refer to FIG. 6).

The second insulating layer 292 covers the second conductive layer. The second insulating layer 292 includes an organic material and/or an inorganic material and has a single-layer or multi-layer structure.

Figure 7C:
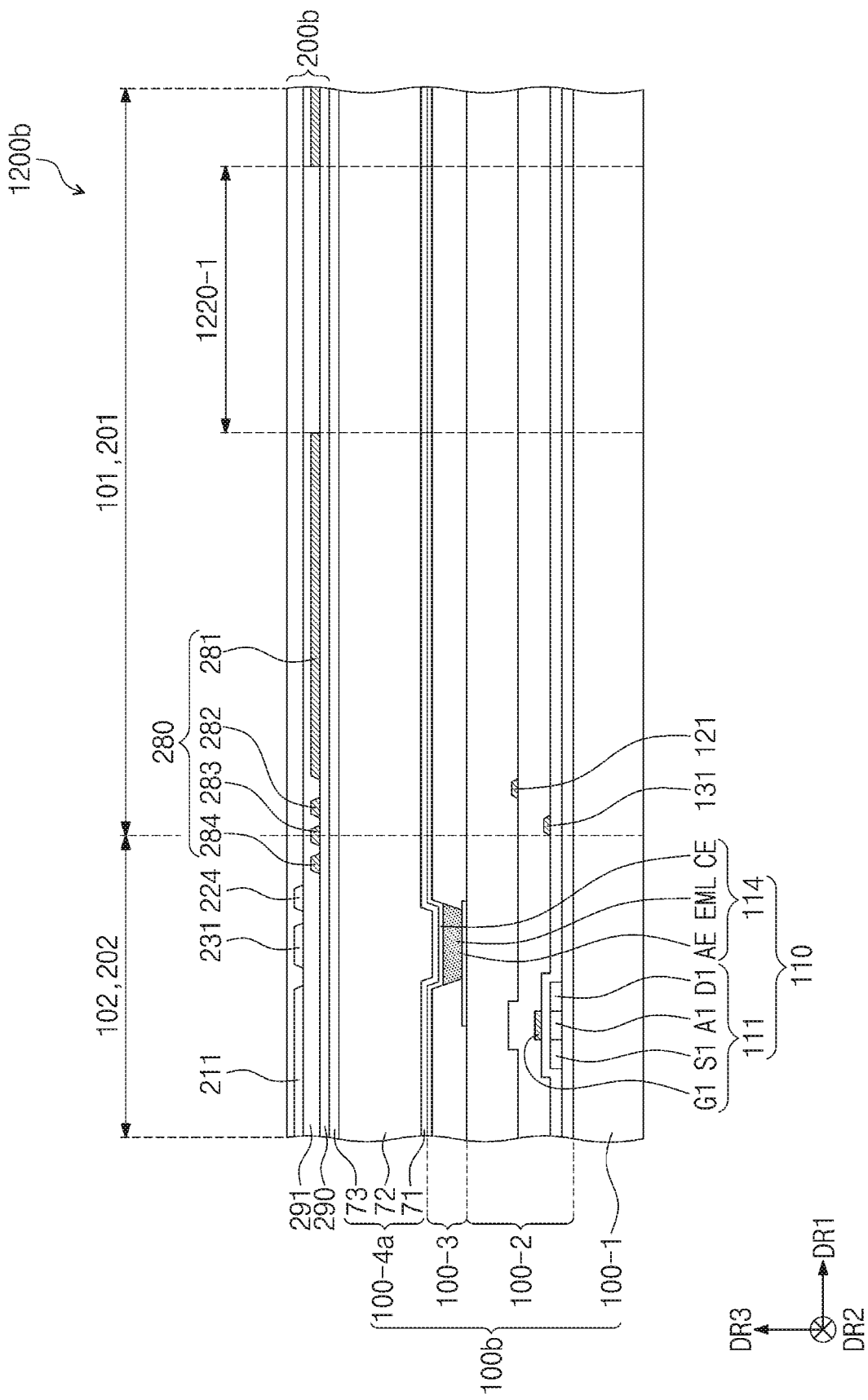
FIG. 7C is a cross-sectional view showing a display module according to an exemplary embodiment of the present disclosure.

FIG. 7C is a cross-sectional view showing a display module 1200b according to an exemplary embodiment of the present disclosure.

Referring to FIG. 7C, the display module 1200b includes a display panel 100b and an input sensor 200b. As compared with FIG. 7B, the module hole 1220 (refer to FIG. 7B) is not defined in the display panel 100b and the input sensor 200b, and a transmissive area 1220-1 is defined.

The transmissive area 1220-1 has a relatively higher transmittance than the second area 102 (refer to FIG. 3). The transmissive area 1220-1 is a space through which external signals input to the electronic modules 1300 (refer to FIG. 2) or signals output from the electronic modules 1300 (refer to FIG. 2) are transmitted.

In the present exemplary embodiment, a second electrode CE is formed to overlap the transmissive area 1220-1. The transmissive area 1220-1 has a relatively higher transmittance than the area in which the pixel 110 is disposed even though the second electrode CE overlaps the transmissive area 1220-1 when the second electrode CE is a transmissive or transflective electrode.

The transmissive area 1220-1 has a shape corresponding to the module hole 1220 in a plan view. For example, the transmissive area 1220-1 has one of a circular shape, an oval shape, a polygonal shape, and a polygonal shape with a curved side on at least one side thereof in the plan view. However, the transmissive area 1220-1 should not be particularly limited.

FIG. 8A is an enlarged plan view showing a portion CC' of FIG. 6. FIG. 8B is a cross-sectional view taken along a line I-I' of FIG. 8A.

Referring to FIGS. 6, 8A, and 8B, a first contact hole 291-1 is defined through the first insulating layer 291. The first contact hole 291-1 is defined in an area overlapping the ground line 261.

A second dummy pattern 232 extends in the area overlapping the ground line 261. Additionally or alternatively, the second dummy pattern 232 is electrically connected to the ground line 261 via the first contact hole 291-1.

Figure 9A:
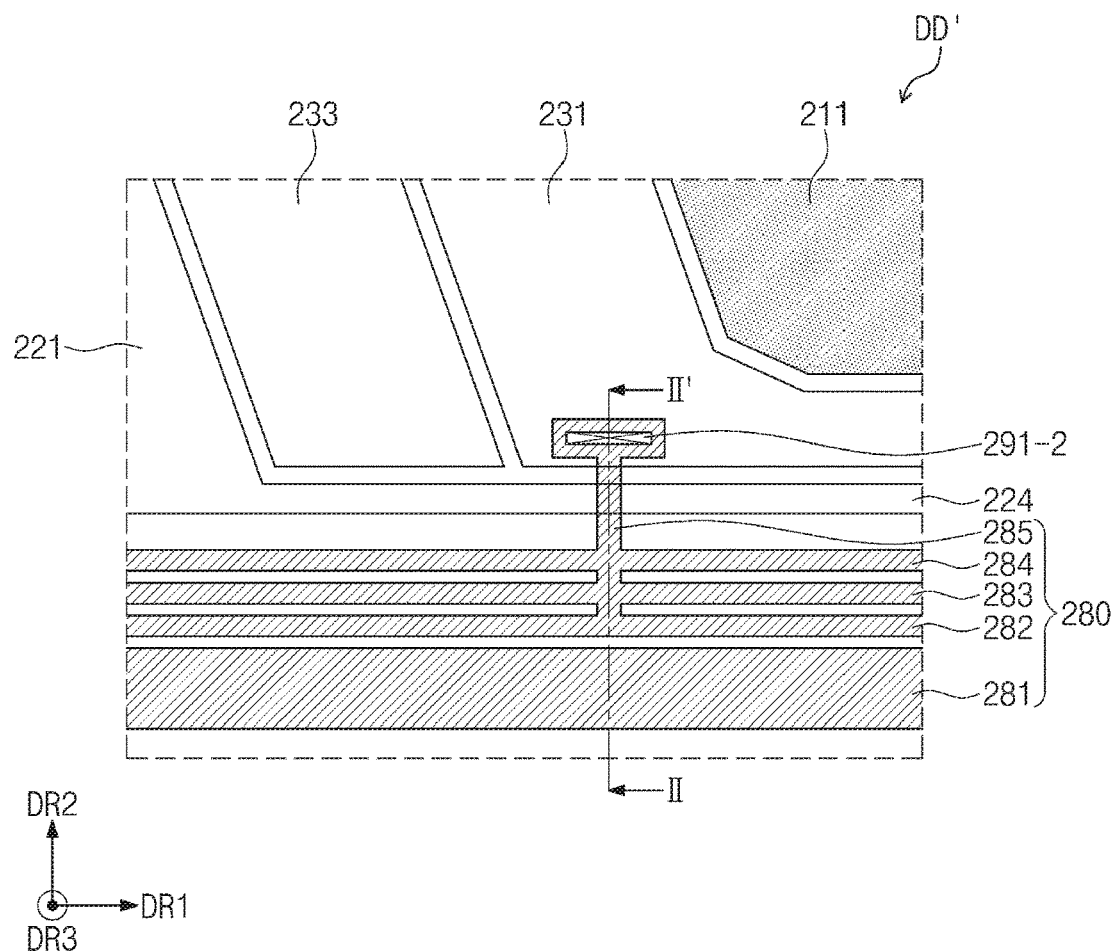
FIG. 9A is an enlarged plan view showing a portion DD' of FIG. 6.
Figure 9B:
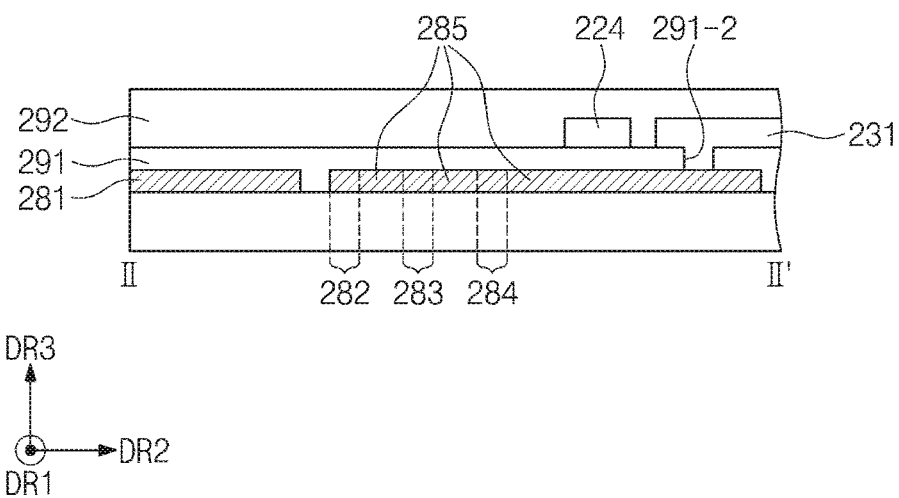
FIG. 9B is a cross-sectional view taken along a line II-II' shown in FIG. 9A.

FIG. 9A is an enlarged plan view showing a portion DD' of FIG. 6. FIG. 9B is a cross-sectional view taken along a line II-II' shown in FIG. 9A.

Referring to FIGS. 6, 9A, and 9B, a cover portion 280 includes a first cover pattern 281, a second cover pattern 282, a third cover pattern 283, a fourth cover pattern 284, and a connection pattern 285.

The first cover pattern 281 is closest to the hole 201-H (refer to FIG. 5). The first cover pattern 281 has a width greater than a width of each of the second, third, and fourth cover patterns 282, 283, and 284. The second cover pattern 282 surrounds the first cover pattern 281 and is spaced apart from the first cover pattern 281. The third cover pattern 283 surrounds the second cover pattern 282. The fourth cover pattern 284 surrounds the third cover pattern 283.

According to the exemplary embodiment of the present disclosure, some components adjacent to the first sensing pattern 211 or the second sensing pattern 221 among the components of the cover portion 280 are electrically connected to a ground line 261. Electric charges of the components are discharged through the ground line 261. Therefore, the destruction of peripheral elements, which is caused when the accumulated electric charges, i.e., the static electricity, are suddenly discharged, may be prevented.

In the exemplary embodiment of the present disclosure, the connection pattern 285 extends from the second cover pattern 282 to an area overlapping the first dummy pattern 231. For example, the connection pattern 285 is connected to the second cover pattern 282, the third cover pattern 283, and the fourth cover pattern 284. The connection pattern 285, the second cover pattern 282, the third cover pattern 283, and the fourth cover pattern 284 have an integral shape.

In the exemplary embodiment of the present disclosure, the connection pattern 285 is not connected to the first cover pattern 281. Accordingly, the first cover pattern 281 is floated. In an exemplary embodiment of the present disclosure, the connection pattern 285 may be connected to the third cover pattern 283 and the fourth cover pattern 284. A second contact hole 291-2 is defined through the first insulating layer 291. The second contact hole 291-2 is defined in an area overlapping the first dummy pattern 231. The first dummy pattern 231 is electrically connected to the connection pattern 285 through the second contact hole 291-2.

The second sensing electrode 220 further includes a connection electrode 224. Referring to FIG. 5, some of the second sensing patterns 221 are spaced apart from each other with the hole 201-H defined therebetween in the second direction DR2. The connection electrode 224 surrounds the hole 201-H to connect the second sensing patterns 221 that are spaced apart from each other with the hole 201-H defined therebetween. The connection electrode 224 is disposed on the same layer as the second sensing patterns 221 and include the same material as the second sensing patterns 221.

Figure 10:
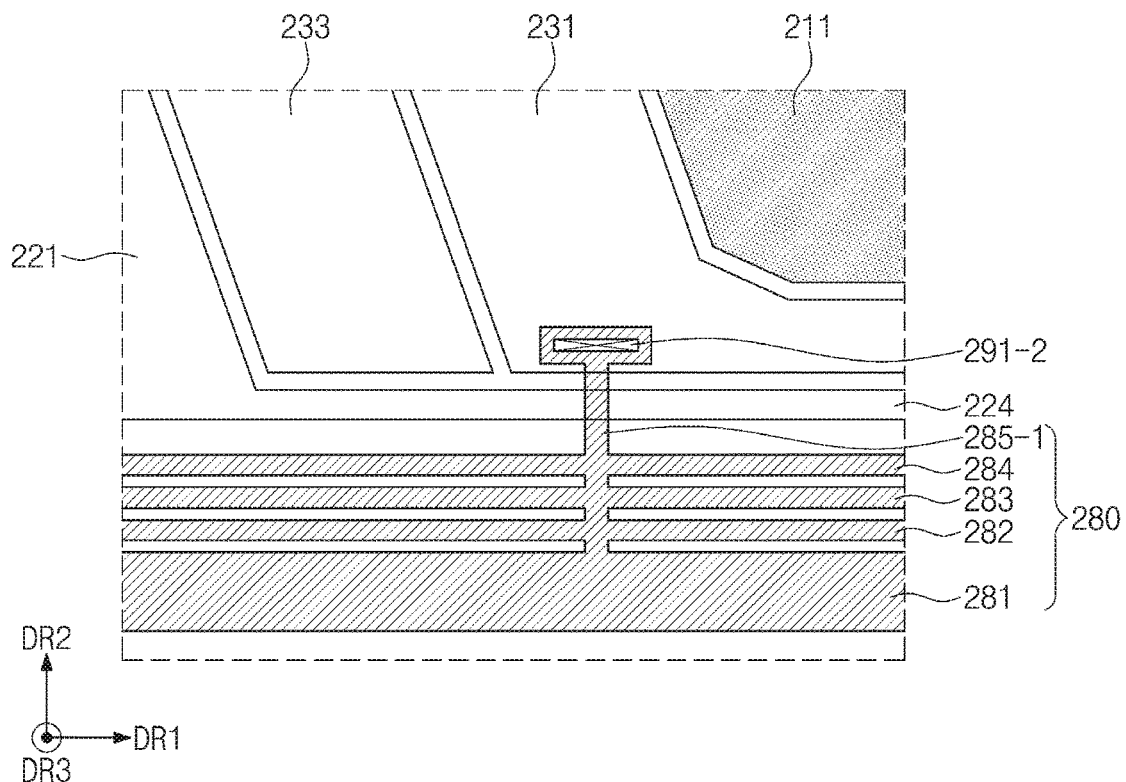
FIG. 10 is an enlarged plan view showing a portion corresponding to the portion DD' of FIG. 6.

FIG. 10 is an enlarged plan view showing a portion corresponding to the portion DD' of FIG. 6.

Referring to FIG. 10, there is a different feature in a connection pattern 285-1 as compared with FIG. 9A. The connection pattern 285-1 further extends to the first cover pattern 281 and is connected to the first cover pattern 281. Accordingly, the first, second, third, and fourth cover patterns 281, 282, 283, and 284, and the connection pattern 285-1 have an integral shape. According to the exemplary embodiment of the present disclosure, components of the cover portion 280 are electrically connected to the ground line 261.

Figure 11:
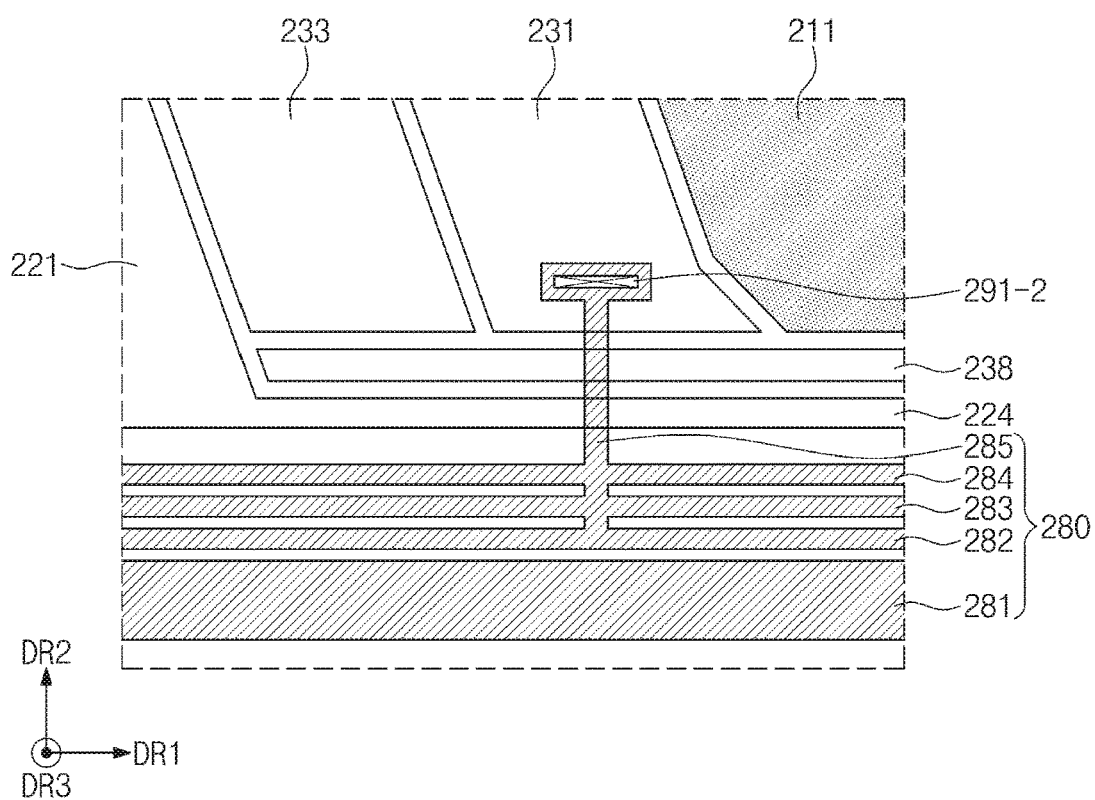
FIG. 11 is an enlarged plan view showing a portion corresponding to the portion DD' of FIG. 6.

FIG. 11 is an enlarged plan view showing a portion corresponding to the portion DD' of FIG. 6.

Referring to FIG. 11, a dummy pattern 238 is further disposed between a connection electrode 224 and a first sensing pattern 211. The dummy pattern 238 is disposed between a third dummy pattern 233 and the connection electrode 224, between a first dummy pattern 231 and the connection electrode 224, and between the first sensing pattern 211 and the connection electrode 224.

The connection electrode 224 and the first sensing pattern 211 are spaced apart from each other by the dummy pattern 238. Therefore, the connection electrode 224 and the first sensing pattern 211 are prevented from being coupled to each other by the dummy pattern 238.

Figure 12:
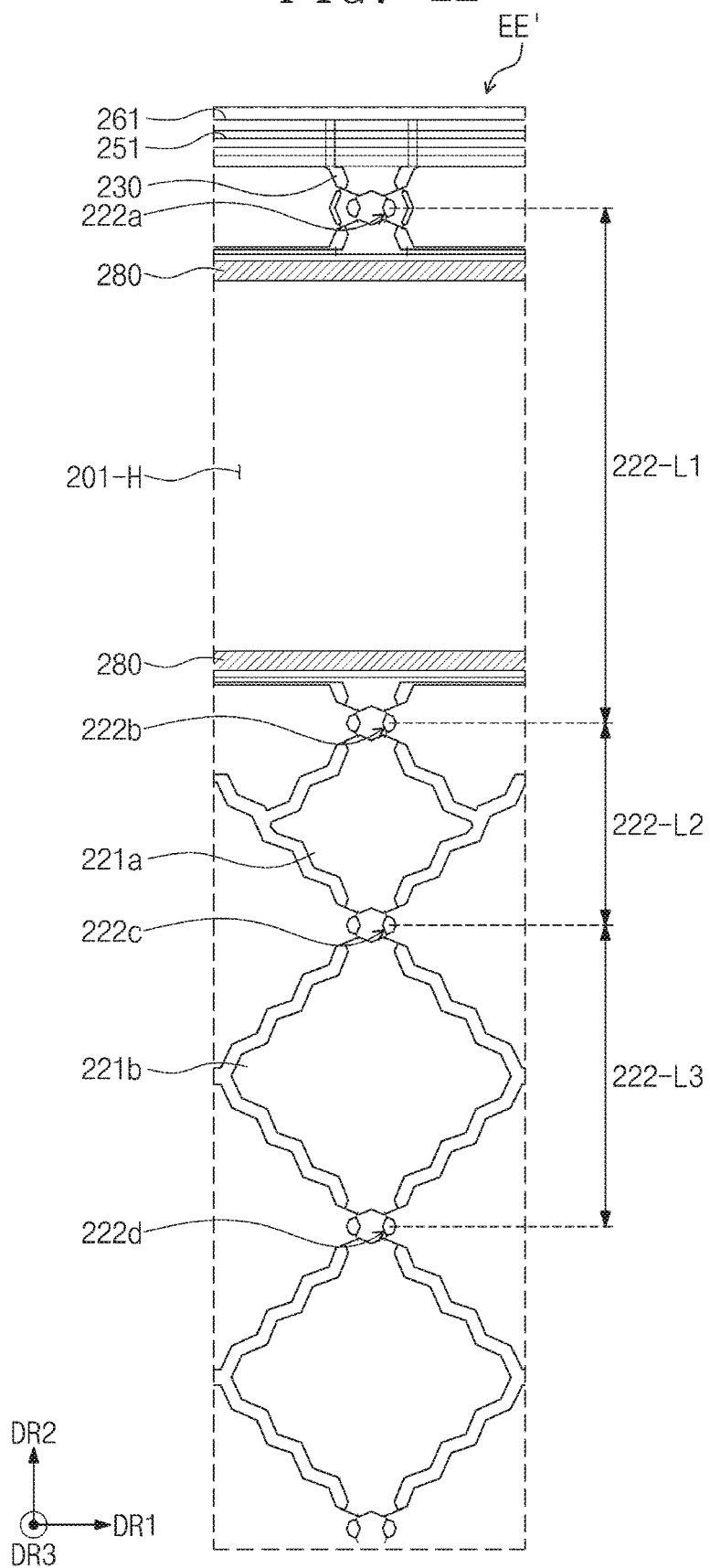
FIG. 12 is an enlarged plan view showing a portion EE' of FIG. 5.

FIG. 12 is an enlarged plan view showing a portion EE' of FIG. 5.

Referring to FIGS. 5 and 12, one second sensing electrode 220 includes the second sensing patterns 221 and the connection units 222. The connection units 222 include a first connection unit 222a, a second connection unit 222b, a third connection unit 222c, and a fourth connection unit 222d.

The first connection unit 222a and the second connection unit 222b are spaced apart from each other with the hole 201-H defined therebetween in the second direction DR2. The third connection unit 222c is spaced apart from the second connection unit 222b in the second direction DR2. The fourth connection unit 222d is spaced apart from the third connection unit 222c in the second direction DR2. The first connection unit 222a, the second connection unit 222b, the third connection unit 222c, and the fourth connection unit 222d are sequentially arranged in the second direction DR2.

A distance 222-L1 between the first connection unit 222a and the second connection unit 222b is greater than a distance 222-L2 between the second connection unit 222b and the third connection unit 222c and a distance 222-L3 between the third connection unit 222c and the fourth connection unit 222d. Additionally or alternatively, the second distance 222-L2 may be smaller than the third distance 222-L3. Accordingly, some sensing patterns among the sensing patterns are deformed in shape. For example, an area of the second sensing pattern 221a connected to the second and third connection units 222b and 222c among the second sensing patterns 221 may be smaller than an area of the second sensing pattern 221b connected to the third and fourth connection units 222c and 222d among the second sensing patterns 221.

Different from the exemplary embodiment of the present disclosure, when the connection units are omitted without adjusting positions of the connection units and the connection patterns to correspond to the shape of the hole 201-H, the bypass pattern 223 (refer to FIG. 6) may be omitted together, and as a result, static failure risk increases. According to the exemplary embodiment of the present disclosure, the positions of the connection units and the connection patterns may be adjusted to correspond to the shape of the hole 201-H. As a result, the static failure risk may be prevented from increasing.

Figure 13:
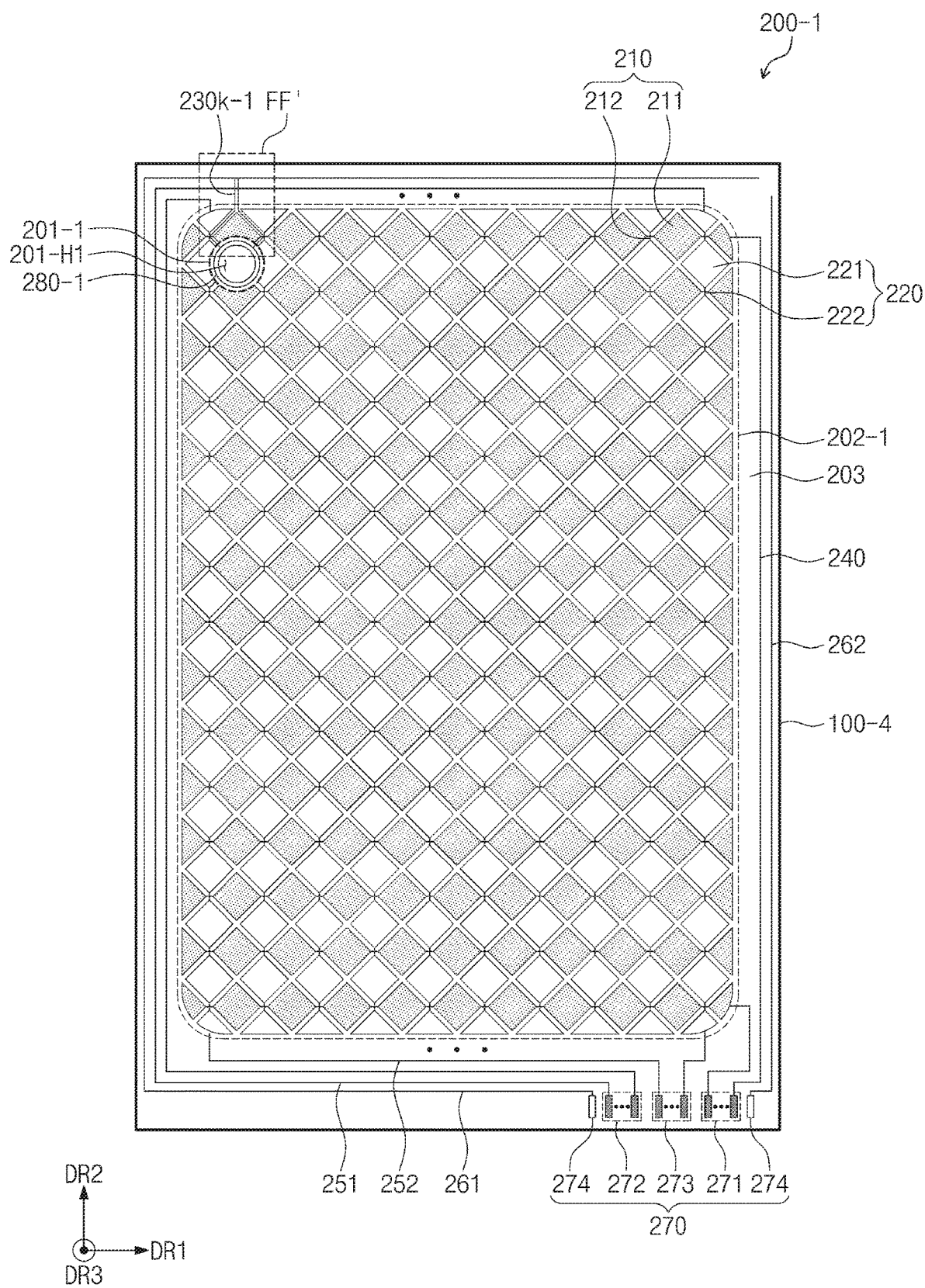
FIG. 13 is a plan view showing an input sensor according to an exemplary embodiment of the present disclosure.

FIG. 13 is a plan view showing an input sensor 200-1 according to an exemplary embodiment of the present disclosure. FIG. 14 is an enlarged plan view showing a portion FF' of FIG. 13.

Referring to FIGS. 13 and 14, the input sensor 200-1 includes a first area 201-1, a second area 202-1, and a third area 203. A hole 201-H1 is defined in the first area 201-1, and the first area 201-1 surrounds the hole 201-H1. The second area 202-1 surrounds the first area 201-1. The hole 201-H1 is disposed to overlap an area in which the connection patterns 212 and the connection units 222 are not disposed.

A cover portion 280-1 is disposed around the hole 201-H1. Additionally or alternatively, the cover portion 280-1 includes a cover pattern 280a and a connection pattern 280b. The cover pattern 280a includes at least one ring-shaped pattern. The connection pattern 280b is electrically connected to the cover pattern 280a. For example, the connection pattern 280b may be disposed on the same layer as the cover pattern 280a and may include the same material as the cover pattern 280a.

The cover portion 280-1 is electrically connected to a ground line 261 through at least one conductive line 230k-1. For example, the cover portion 280-1 is electrically connected to the ground line 261 through two conductive lines 230k-1.

Each of the conductive lines 230k-1 includes a first dummy pattern 231-1, a second dummy pattern 232-1, a dummy island pattern 235-1, a first dummy bridge pattern 236-1, and a second dummy bridge pattern 237-1. The first dummy pattern 231-1, the second dummy pattern 232-1, and the dummy island pattern 235-1 are disposed on the same layer as the first sensing patterns 211 and the second sensing patterns 221. The first dummy bridge pattern 236-1 and the second dummy bridge pattern 237-1 are disposed on the same layer as the cover portion 280-1 and the ground line 261.

In the exemplary embodiment of the present disclosure, the cover portion 280-1 is electrically connected to the ground line 261. The electric charges generated during the process are not accumulated in the cover portion 280-1 and are discharged through the ground line 261. Accordingly, the electric charges are prevented from accumulating on the cover portion 280-1, and the peripheral elements, e.g., the first sensing pattern 211 or the second sensing pattern 221, are prevented from being damaged when the static electricity is suddenly discharged.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. An electronic device comprising:
a base substrate comprising a hole, a first area surrounding the hole, a second area surrounding the first area, and a third area surrounding the second area;
a cover pattern disposed in the first area and surrounding the hole;
a connection pattern protruding from the cover pattern to the second area;
a first dummy pattern disposed in the second area and overlapping the connection pattern;
a second dummy pattern electrically connected to the first dummy pattern and extending from the second area to the third area; and
a ground line disposed in the third area, overlapping the second dummy pattern, and electrically connected to the second dummy pattern.

2. The electronic apparatus of claim 1, further comprising:
a dummy island pattern disposed between the first dummy pattern and the second dummy pattern;
a first dummy bridge pattern connected to the dummy island pattern and the first dummy pattern; and
a second dummy bridge pattern connected to the dummy island pattern and the second dummy pattern.

3. The electronic apparatus of claim 2, wherein the first dummy pattern, the second dummy pattern, and the dummy island pattern are disposed on a first layer, and the cover pattern, the ground line, the first dummy bridge pattern, and the second dummy bridge pattern are disposed on a second layer different from the first layer.

4. The electronic apparatus of claim 1, wherein the cover pattern is provided in plural, the cover patterns comprise a first cover pattern with a first width and a second cover pattern spaced apart from the hole such that the first cover pattern is disposed between the hole and the second cover pattern, and wherein the second cover pattern has a second width smaller than the first width, the second cover pattern is electrically connected to the ground line, and the first cover pattern is electrically connected to the ground line or floated.

5. An apparatus comprising:
- a display panel comprising an active area and a peripheral area, wherein the active area comprises a hole extending through the display panel;
- a cover portion disposed on the display panel and surrounding the hole;
- a plurality of sensing electrodes disposed on the active area of the display panel;
- a dummy electrode disposed on the active area of the display panel; and
- a ground line disposed on the peripheral area of the display panel and electrically connected to the cover portion through the dummy electrode.

* * * * *